(12) United States Patent
Shen

(10) Patent No.: US 12,412,803 B2
(45) Date of Patent: Sep. 9, 2025

(54) LID ALLOWING FOR A THERMAL INTERFACE MATERIAL WITH FLUIDITY IN A LIDDED FLIP CHIP PACKAGE

(71) Applicant: Yuci Shen, San Jose, CA (US)

(72) Inventor: Yuci Shen, San Jose, CA (US)

( * ) Notice: Subject to any disclaimer, the term of this patent is extended or adjusted under 35 U.S.C. 154(b) by 711 days.

(21) Appl. No.: 17/695,826

(22) Filed: Mar. 15, 2022

(65) Prior Publication Data

US 2023/0298960 A1  Sep. 21, 2023

(51) Int. Cl.
*H01L 23/367* (2006.01)
*H01L 23/40* (2006.01)
*H01L 23/42* (2006.01)

(52) U.S. Cl.
CPC .......... *H01L 23/3675* (2013.01); *H01L 23/40* (2013.01); *H01L 23/4006* (2013.01); *H01L 23/42* (2013.01); *H01L 2023/4018* (2013.01); *H01L 2023/4087* (2013.01)

(58) Field of Classification Search
CPC ..... H01L 21/563; H01L 23/053; H01L 23/36; H01L 23/367; H01L 23/3675; H01L 23/46; H01L 23/467; H01L 23/473
See application file for complete search history.

(56) References Cited

U.S. PATENT DOCUMENTS

| | | | |
|---|---|---|---|
| 2018/0294206 A1* | 10/2018 | Chainer | H01L 23/427 |
| 2020/0183323 A1* | 6/2020 | Shen | G03G 21/185 |
| 2020/0350228 A1* | 11/2020 | Shen | H01L 23/3675 |
| 2020/0350231 A1* | 11/2020 | Shen | H01L 23/4334 |
| 2023/0124783 A1* | 4/2023 | Kim | H01L 23/293 257/712 |

FOREIGN PATENT DOCUMENTS

| | | | | |
|---|---|---|---|---|
| WO | WO-2022252233 A1 * | 12/2022 | | H01L 23/473 |
| WO | WO-2023283842 A1 * | 1/2023 | | H01L 23/3128 |

* cited by examiner

*Primary Examiner* — Nelson Garces

(57) ABSTRACT

The disclosure describes a lid allowing for a thermal interface material with fluidity, like a liquid metal, in a lidded flip chip package, including: a lid, a sealing ring for forming a sealed gap between a flip chip and the lid, a storage tunnel in the lid for accepting or releasing a liquid from or to the sealed gap, a connecting hole connecting the sealed gap with the storage tunnel, an injection hole with a plug, wherein a plug structure is formed at an outer end of the storage tunnel for opening or closing it, a slippery skin is arranged on an inner surface of the storage tunnel for a better flow of a liquid metal in it, the sealed gap is completely filled with a liquid metal, and a portion of the storage tunnel is filled with the same liquid metal and its remaining portion is filled with a gas.

13 Claims, 21 Drawing Sheets

LID ALLOWING FOR A THERMAL INTERFACE MATERIAL WITH FLUIDITY IN A LIDDED FLIP CHIP PACKAGE

TECHNICAL FIELD OF THE DISCLOSURE

The disclosure relates generally to a heat-dissipating object for dissipating heat from a heat-generating object in an electronic device, and particularly to a lid for a lidded flip chip package to use a liquid thermal interface material (TIM) or a TIM having fluidity at least during operation temperature of the lidded flip chip package.

BACKGROUND OF THE DISCLOSURE

In a flip chip package with a semiconductor chip being a heat-generating object, a thermal interface material (TIM) is usually used to fill the gap between the flip chip and a heat-dissipating object, like a lid or a heat sink for transferring the heat from one to the other. The types of the TIM basically include thermal pad, thermal grease, phase change material and liquid metal. A good TIM needs to have 1) a high thermal conductivity, 2) a good surface wetting capability for reducing the thermal contact resistance, 3) a good gap filling capability, and 4) a good thermal reliability in test or application. A liquid metal as TIM usually includes gallium and gallium alloy. The melting point of the gallium is about 29° C., and that of gallium alloy is even lower. The thermal conductivity of the liquid metal is much higher than the extensively used thermal pad or thermal grease. Furthermore, a liquid metal has much better capability for surface wetting and gap filling. So, of all the types of TIM, a liquid metal is an ideal TIM if only looking at the first three items. If a liquid metal can be used in a lidded flip chip package, the temperature of the lidded flip chip package can be reduced significantly as compared to other types of TIM. However, the conventional lidded flip chip packages based on a conventional lid of prior arts are limited to use a liquid metal as its TIM due to the pumping-out issue, that is, when the package is under a thermal cycling test or in its long term of application, the volume of the gap between the flip chip and the lid varies with temperature due to the warpage of the flip chip, causing the liquid metal TIM to be pumped out. The TIM pumping-out issue will cause an incomplete gap filling between the flip chip and the lid, reducing the thermal performance of TIM. More importantly, because liquid metal is electrically conductive, a small amount of TIM pumping-out may damage the whole electronic device. As a result, a liquid metal type of TIM has not been commercially used in a lidded flip chip package. In general, because of similar reasons, a liquid metal type of TIM is rarely interposed between a heat-dissipating object (a heat sink, for example) and a heat-generating object (a semiconductor chip, for example) in an electronic device.

For overcoming the TIM pumping-out issue for an electronic device such as a lidded flip chip package to use a liquid TIM, a lid coupled with a reservoir structure for a lidded flip chip package to use a liquid thermal interface material has been disclosed in our prior arts, U.S. Ser. No. 10/643,924 B1 and U.S. application Ser. No. 17/686,372. However, the lid and the lidded flip chip package of the prior arts still have two disadvantages in its test and application. One is that a preferred liquid metal TIM, including gallium or its alloys, will oxidize when exposed to oxygen in an ambient of the lid and its lidded flip chip package of the prior arts. The liquid metal oxides formed from oxidation may accumulate with time to affect the flow of the liquid metal in the tunnel of the lid. Another disadvantage is that when a tunnel is formed by using an adhesive tape to bond a covering piece over a notch, the flow of the liquid metal in the tunnel is not very good. As a result, the sealed gap between the lid and the flip chip may become incompletely filled with the liquid metal. To eliminate the disadvantages, a lid and its lidded flip chip package are described in the present disclosure.

SUMMARY OF THE DISCLOSURE

A lid allowing for a thermal interface material with fluidity in a lidded flip chip package, comprising: a top piece with an upper side and a lower side, a foot at the lower side of the top piece, and a reservoir structure including a storage tunnel, an injection hole, and a sealing ring; wherein the sealing ring is mounted at the lower side of the top piece, which seals a peripheral edge region at a top surface of a flip chip and/or seals a peripheral region around a flip chip and at a top surface of a substrate so as to form a sealed gap between the flip chip and the top piece; wherein the lid further includes a ring-form of cavity at the upper side of its top piece, a pattern of notch formed at a bottom of the ring-form of cavity, and a covering piece mounted in the ring-form of cavity so as to cover the pattern of notch and form the storage tunnel; wherein the storage tunnel has two ends, one end of the said two ends connects to the sealed gap through a connecting hole, and a plug structure including a hole and a plug is formed at the other end of the said two ends; wherein the injection hole has two ends, one end of the said two ends connects to the sealed gap directly or through an injection tunnel, and a plug structure including a hole and a plug is formed at the other end of the said two ends; and wherein the sealed gap is completely filled with a thermal interface material having fluidity, a portion of the storage tunnel is filled with the same thermal interface material, and the remaining portion of the storage tunnel is filled with a gas.

A method for making a lidded flip chip package based on the lid of present disclosure, comprising the following major steps:

1) Prepare a lid according to a flip chip package;
2) Form a slippery skin on an inner surface of the storage tunnel;
3) Mount the lid on the substrate and over the flip chip, wherein the sealing ring is tightly compressed so as to seal a peripheral edge region at a top surface of the flip chip and form a sealed gap between the flip chip and the top piece of the lid;
4) Put the assembly formed in step 3 into a vacuum oven or container and set it to a vacuum condition to degas the assembly, and then fill a liquid metal through the injection hole into the sealed gap and a portion of the storage tunnel;
5) Close the injection hole by putting back its plug at the vacuum condition first, and then put a desired gas with a desired gas pressure into the vacuum oven or container to fill the remaining portion of the storage tunnel with the gas;
6) Close the storage tunnel by putting back its plug so that the gas is sealed inside the storage tunnel;
7) Mount solder balls at a bottom side of the substrate so that a lidded flip chip package is formed.

A method for making a lidded flip chip package based on the lid of present disclosure, comprising the following major steps:

1) Prepare a lid according to a flip chip package;
2) Form a slippery skin on an inner surface of the storage tunnel;
3) Attach a piece of pre-formed liquid metal pad or form a liquid metal pad at a bottom surface of the top piece and inside the sealing ring under a low temperature;
4) Clamp the lid formed in step 3 onto the flip chip package prepared in step 1 using a clamping force, wherein an adhesive is interposed between the foot of the lid and the substrate, the sealing ring is compressed to seal at a peripheral edge region at a top surface of the flip chip and form a sealed gap between the lid and flip chip, and the liquid metal pad is clamped between the lid and the flip chip and enclosed in the sealed gap;
5) Put the assembly formed in step 4 into a vacuum oven or container and set it to a vacuum condition to degas the assembly, and then raise the oven temperature above the melting point of the liquid metal and hold this temperature for a period of time until the liquid metal pad becomes molten, so that the seal ring is further compressed, the thickness of the of the sealed gap becomes thinner, the adhesive is compressed to spread between the foot and the substrate, and the molten liquid metal pad is squeezed to fill the sealed gap and a portion of the storage tunnel; and then raise the oven temperature to a curing temperature of the adhesive and hold it until the adhesive becomes cured;
6) Put a desired gas with a desired gas pressure into the vacuum oven or container to fill the remaining portion of the storage tunnel with the gas;
7) Close the storage tunnel by putting back its plug so that the gas is sealed inside the storage tunnel;
8) Mount solder balls at a bottom side of the substrate so that a lidded flip chip package is formed.

The features and advantages of the embodiments of the present disclosure will become more apparent from the detailed descriptions in conjunction with the drawings below. The drawings and associated descriptions are to illustrate the embodiments of the present disclosure, not to limit the scope of what is claimed.

DETAILED DESCRIPTION OF THE PREFERRED EMBODIMENT

The present disclosure is to eliminate the disadvantages of the prior arts mentioned previously by introducing a plug structure at an end of a storage tunnel and a slippery skin on an inner surface of the storage tunnel of a lid for a lidded flip chip package, which is described in conjunction with the drawings in the following.

Figure 1:
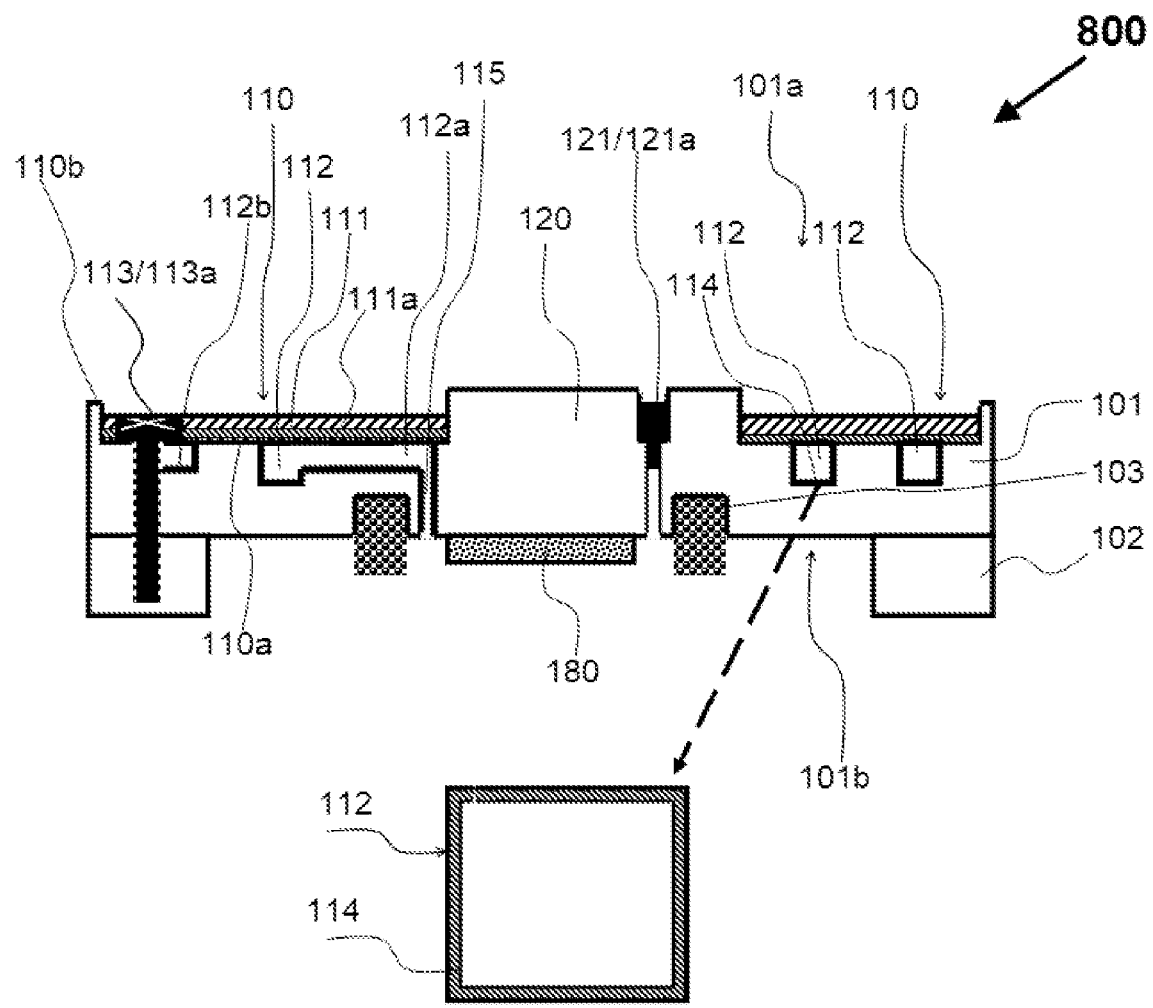
FIG. 1 to FIG. 3 are schematic diagrams for illustrating a lid allowing for a lidded flip chip package to use a thermal interface material with fluidity of one preferred embodiment of the present disclosure.
Figure 1A:
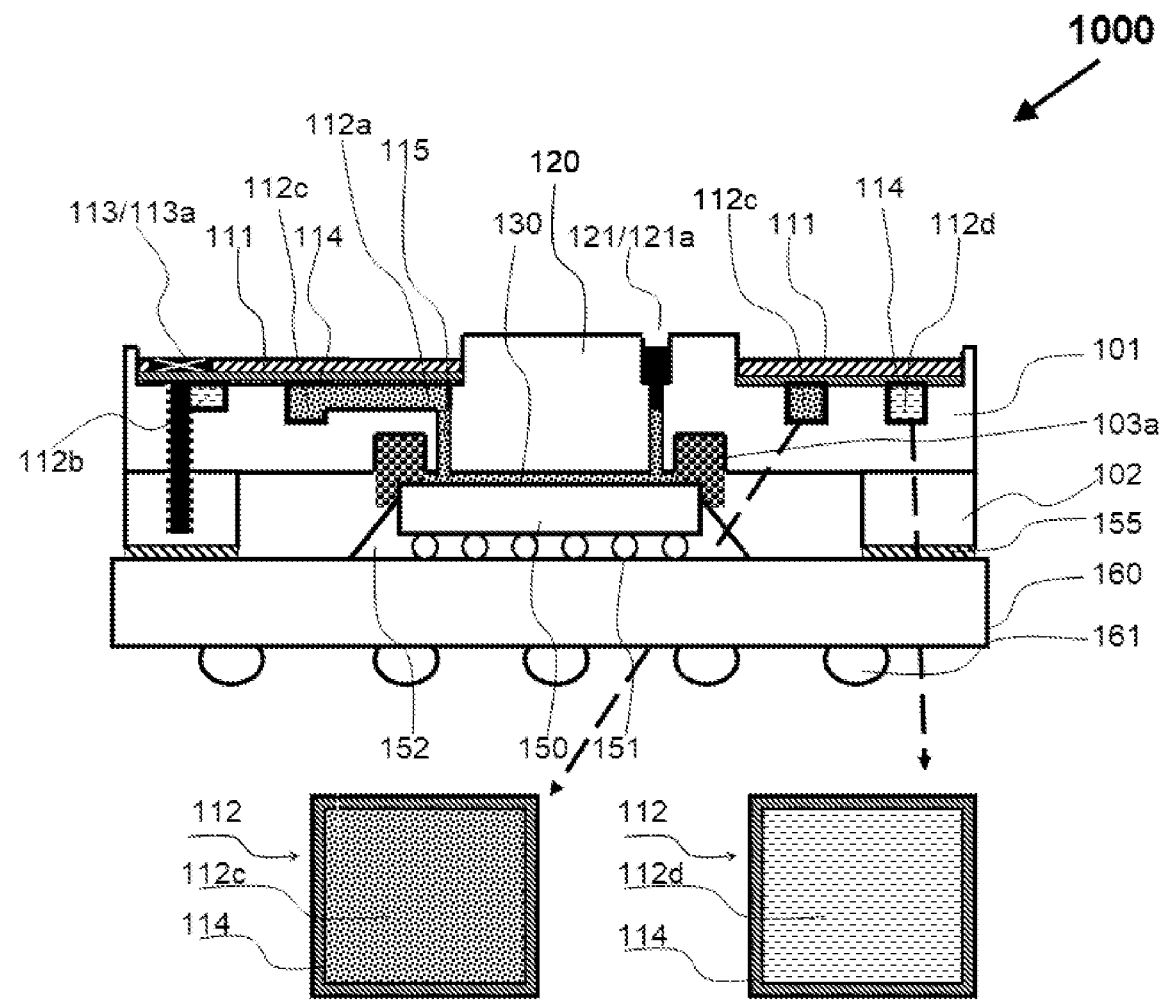

FIG. 1 and FIG. 1A are schematic diagrams for illustrating a lid allowing for a thermal interface material with fluidity in a lidded flip chip package of one preferred embodiment of the present disclosure. The numerical symbol 800 in FIG. 1 designates a cross-sectional view of a lid, in which the numerical symbol 101 designates a top piece with an upper side 101*a* and a lower side 101*b*, the 102 designates a foot at the lower side 101*b* of the top piece 101, the 112 designates a storage tunnel as a reservoir for accepting or releasing a liquid, the 121/121*a* designates an injection hole 121 with a plug 121*a* as a plug structure, and the 103 designates a sealing ring; wherein the sealing ring 103 is mounted at the lower side 101*b* of the top piece 101; wherein the lid 800 further includes a ring-form of cavity 110 at the upper side 101*a* of its top piece 101, a pattern of notch 112 (which uses the same numerical number 112 as that for the storage tunnel) formed at a bottom 110*a* of the ring-form of cavity 110, and a covering piece 111 mounted in the ring-form of cavity for covering the pattern of notch 112 so as to form the storage tunnel 112; wherein the storage tunnel 112 has two ends 112*a* and 112*b*, one end 112*a* connects to a bottom surface of the top piece 101 at its lower side 101*b* and inside the sealing ring 103 through a connecting hole 115, and a plug structure 113/113*a* including a hole 113 and a plug 113*a* is formed at the other end 112*b* of the storage tunnel 112 for opening or closing it to or from an outside of the lid or an ambient, like the atmosphere outside the lid; wherein the lid further includes a slippery skin 114 formed on an inner surface of the storage tunnel 112, which can be made of either a lubricant oil or some other kind of coating, as showed by the enlarged cross-sectional view of the storage tunnel 112 that the dashed arrow points to; and wherein the injection hole 121 is formed through the top piece 101 and connects to a bottom surface at its lower side 101*b* and inside the sealing ring 103. The numerical symbol 120 in FIG. 1 designates an island portion of the top piece 101 surrounded by the ring-form cavity 110, which is directly above a flip chip when the lid is mounted with a flip chip package as illustrated in FIG. 1A in the following. The 110*b* in FIG. 1 designates a rim of the ring-form cavity 110. The numerical symbol 180 in FIG. 1 designates a piece of pre-formed liquid metal pad in a solid state mounted on a bottom surface at the lower side of the top piece 101 and inside the sealing ring 103, which is optionally used to form a liquid metal thermal interface material when the lid is mounted with a flip chip package as illustrated in FIG. 13 to FIG. 17 below for a method for making a lidded flip chip package with a liquid metal thermal interface material of one embodiment of the present disclosure. It is noted that the numerical symbol 111a in FIG. 1 designates an adhesive layer as an option for bonding the covering piece 111 to the ring-form cavity in order to cover the pattern of notch 112. If a metal to metal welding is used to mount a metal covering piece 111 in the ring-form cavity for covering a pattern of notch 112, the adhesive layer 111a can be avoided.

FIG. 1A is a schematic diagram for illustrating a lidded flip chip package based on the lid described previously in conjunction with the drawing in FIG. 1 of one preferred embodiment of the present disclosure. It is noted that the same elements in a following drawing will share the same numerical symbols as described in a previous drawing, which may not be repeatedly described in the following drawing for simplicity and clearness, and the descriptions in the previous drawing should be referred to when needed. The numerical symbol 1000 in FIG. 1A designates a cross-sectional view of a lidded flip chip package based on the lid as described in FIG. 1, in which the numerical symbol 150 designates a flip chip mounted on a substrate 160 through a plurality of bumps 151 and an underfill material 152, the numerical symbol 155 designates an adhesive interposed between the foot 102 and the substrate 160 for mounting the lid 800 as described in FIG. 1 on a peripheral region of the substrate 160 and over the flip chip 150, the numerical symbol 103a designates the sealing ring 103 as described in FIG. 1, which is compressed so as to seal a peripheral edge region at a top surface of the flip chip 150 and form a sealed gap 130 between the flip chip 150 and the top piece 101, the numerical symbol 115 designates a connecting hole which connects the storage tunnel 112 as described in FIG. 1 with the sealed gap 130, the numerical symbol 130 also designates a thermal interface material having fluidity, like a liquid metal, completely filled in the sealed gap 130, the numerical symbols 112a and 112b designate two ends of the storage tunnel 112 as described in FIG. 1, and the 112c and 112d designate two portions of the storage tunnel 112, a portion 112c is filled with the same thermal interface material having fluidity, and the remaining portion 112d is filled with a gas, the 112c and 112d also designate the thermal interface material having fluidity and the gas filled in the two portions, respectively, the 121 designates an injection hole which is closed by a plug 121a after the thermal interface material having fluidity is formed in the sealed gap 130 and the portion of the storage tunnel 112c, and the 113/113a designates a plug structure at an outer end 112b of the storage tunnel 112, which is closed as an option in the application of the lidded flip chip package so that a desired gas with a desired pressure can be set in the remaining portion 112d of the storage tunnel 112.

It is noted that the liquid metal gallium or its alloys are preferred to be a thermal interface material having fluidity of a lidded flip chip package of one preferred embodiment of the present disclosure. However, gallium or its alloys will quickly oxidize when exposed to oxygen or air. Because the liquid metal will move forwards or backwards between the storage tunnel 112 and the sealed gap 130, a liquid metal oxide formed from continuous oxidation will accumulate with time if the outer end 112b of the storage tunnel 112 is not isolated from air in the atmosphere. As a result, it will become difficult for the liquid metal to flow in the storage tunnel 112. To solve the oxidation issue, a plug structure like the screw hole 113 with the screw 113a is formed at the end 112b of the storage tunnel 112 so that a desired gas 112d, like an inert gas including nitrogen or helium, with a desired gas pressure can be formed in the remaining portion of the storage tunnel 112d. The plug structure can be used to open or close the end 112b of the storage tunnel 112 when needed, which will be further explained in conjunction with the drawings in FIG. 9 to FIG. 17 below. It is also noted that the gas used in the remaining portion of the storage tunnel 112d is not limited to an inert gas. When air is used as the gas in the remaining portion 112d of the storage tunnel 112, there will be some oxidation, but the oxidation will stop when the oxygen inside the storage tube is used up. In addition, to improve the flow of the liquid metal in the storage tube, a slippery skin 114 as an option is formed on an inner surface of the storage tunnel 112, and a method to form a slippery skin on an inner surface of the storage tunnel 112 and to arrange a desired gas with a desired gas pressure in the remaining portion of the storage tunnel 112d will be illustrated in conjunction with drawings in FIG. 9 to FIG. 17 below, where a method for making a lidded flip chip package based on a lid of one preferred embodiment of the present disclosure is described.

Figure 2:
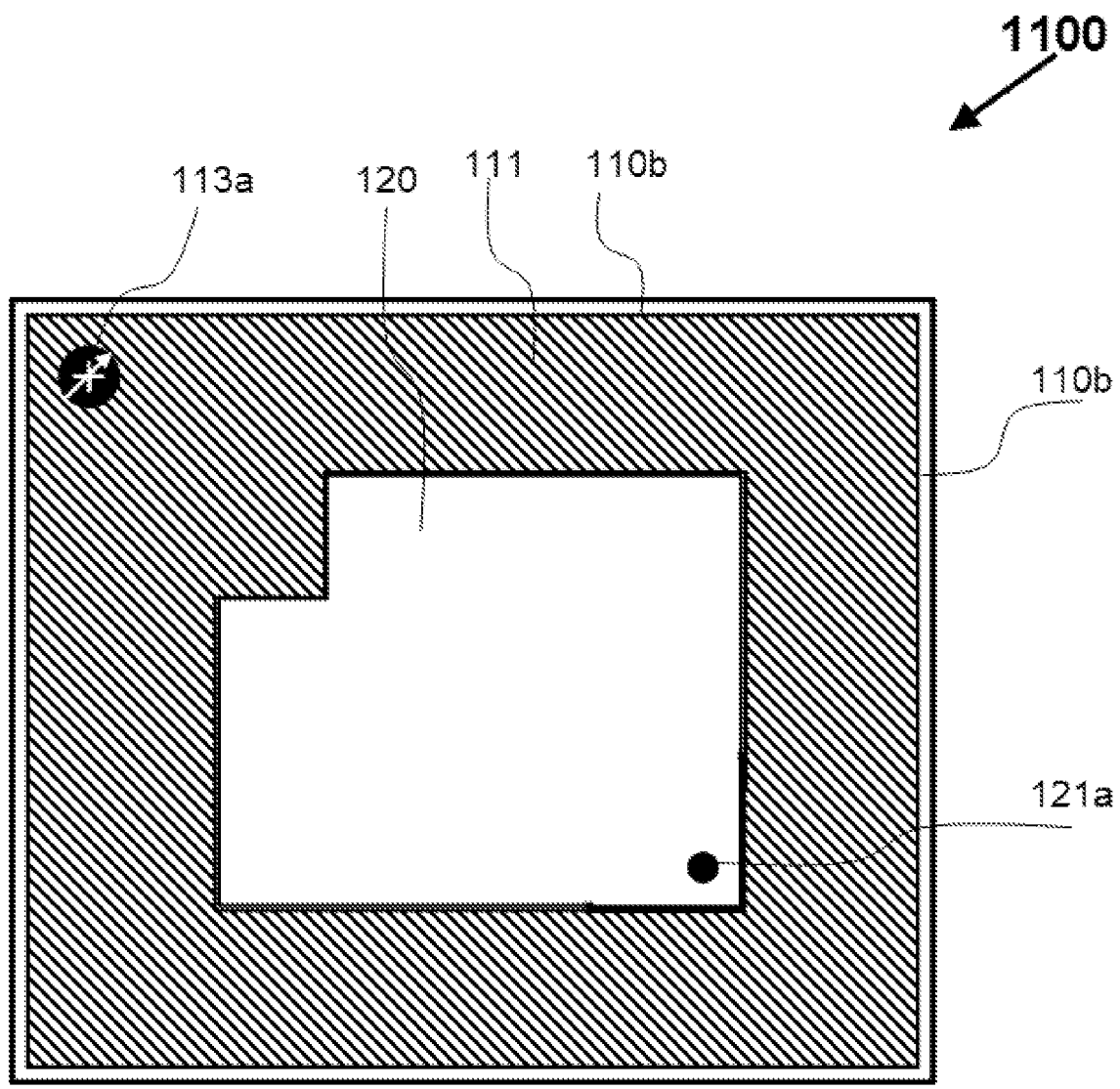
Figure 3:
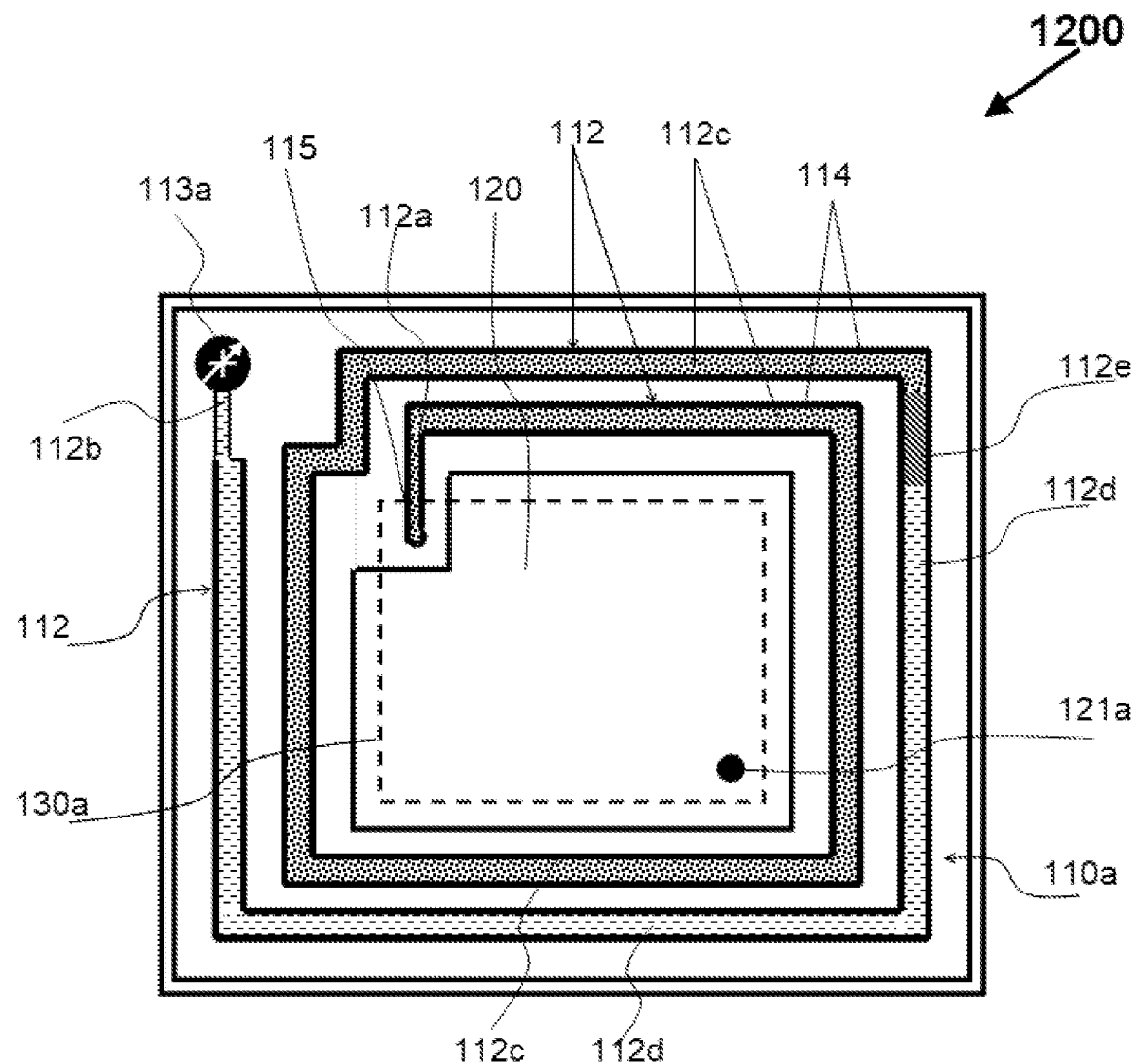

FIG. 2 and FIG. 3 are schematic diagrams for further illustrating the lidded flip chip package 1000 as shown in FIG. 1A from its top view. It is noted that the same numerical symbol will be used to designate the same element in both cross-sectional view and top view. The numerical symbol 1100 in FIG. 2 designates a top view of the lidded flip chip package as described in FIG. 1A, in which the numerical symbols 120 and 110b designate a top view of the island portion 120 and the rim 110b of the top piece 101 as shown in FIG. 1 or FIG. 1A, the ring-form cavity 110 as shown in FIG. 1 is formed between the island portion 120 and the rim 110b, the 111 designates a top view of the covering piece 111 in FIG. 1 or FIG. 1A, which is mounted in the ring-form cavity 110, and the numerical symbols 121a and 113a respectively designate a top view of the plug 121a and the plug 113a as shown in FIG. 1 or FIG. 1A. It is noted that the covering piece does not have to be a single layer, and can also be a plurality of layers of foils that are bonded together with adhesive or metal bonded. The numerical symbol 1200 in FIG. 3 designates a top view of the lidded flip chip package as described in FIG. 1A, where the covering piece 111 as shown in FIG. 2 is removed to better display the structure of the storage tunnel 112, a thermal interface material with fluidity 112c, like a liquid metal, and a gas 112d in the storage tunnel 112. The numerical symbols 112 and 114 in FIG. 3 respectively designate a top view of the storage tunnel 112 (which is a pattern of notch in the ring-form cavity 110 after the covering piece 111 is removed) and the slippery skin 114 on an inner surface of the storage tunnel 112 as shown in FIG. 1 or FIG. 1A, the 112a and the 112b in FIG. 3 designate a top view of the two ends of the storage tunnel 112, the end 112a, called an inner end, is connected to the sealed gap 130 through the connecting hole 115, the end 112b, called an outer end, is coupled with the plug structure 113/113a for opening or closing the storage tunnel 112 to/from an outside environment, like air in outside atmosphere or an inert gas in an oven or container, the 112c and the 112d in FIG. 3 respectively designate a top view of the thermal interface material having fluidity 112c, like a liquid metal in a portion of the storage tunnel 112 and the gas 112d in the remaining portion of the storage tunnel 112 as shown in FIG. 1A. The numerical symbols 121a designates a top view of the plug 121a in the injection hole 121 as shown in FIG. 1 or FIG. 1A. The dashed rectangle designated by the numerical symbol 130a in FIG. 3 displays the region of the sealed gap 130 as shown in FIG. 1A from its top view, which can be viewed as a reference to understand the relative locations among the elements in the lidded flip chip package 1000. The numerical symbol 112e designates a small amount of protecting liquid as an option, like a lubricant oil, positioned at an outer end of the liquid metal to avoid it from directly contacting with the gas 112d so as to improve the flow of the liquid metal in the storage tunnel from one side and to avoid the oxidation of the liquid metal if air is used as the gas from the other side.

It is noted that the pattern and dimension of the storage tunnel 112 can be flexibly designed according to a specific application for a specific flip chip package. Some basic considerations to design the storage tunnel 112 include: 1) its volume needs to be big enough to accommodate the volume change of the sealed gap 130, which can be very big. For example, the maximum volume of the sealed gap may be double that of its minimum volume due to a warpage behavior of the flip chip 150 during a large temperature range, like −40° C. to 245° C.; 2) A division of the storage tunnel 112 as a portion 112c for liquid metal and another portion 112d for a gas needs to be carefully determined so that the sealed gap can be completely filled with the liquid metal all the time; and 3) a safe and easy plug structure 113/113a or 121/121a for the storage tunnel 112 or the injection hole is important, which will be further described below.

Figure 4:
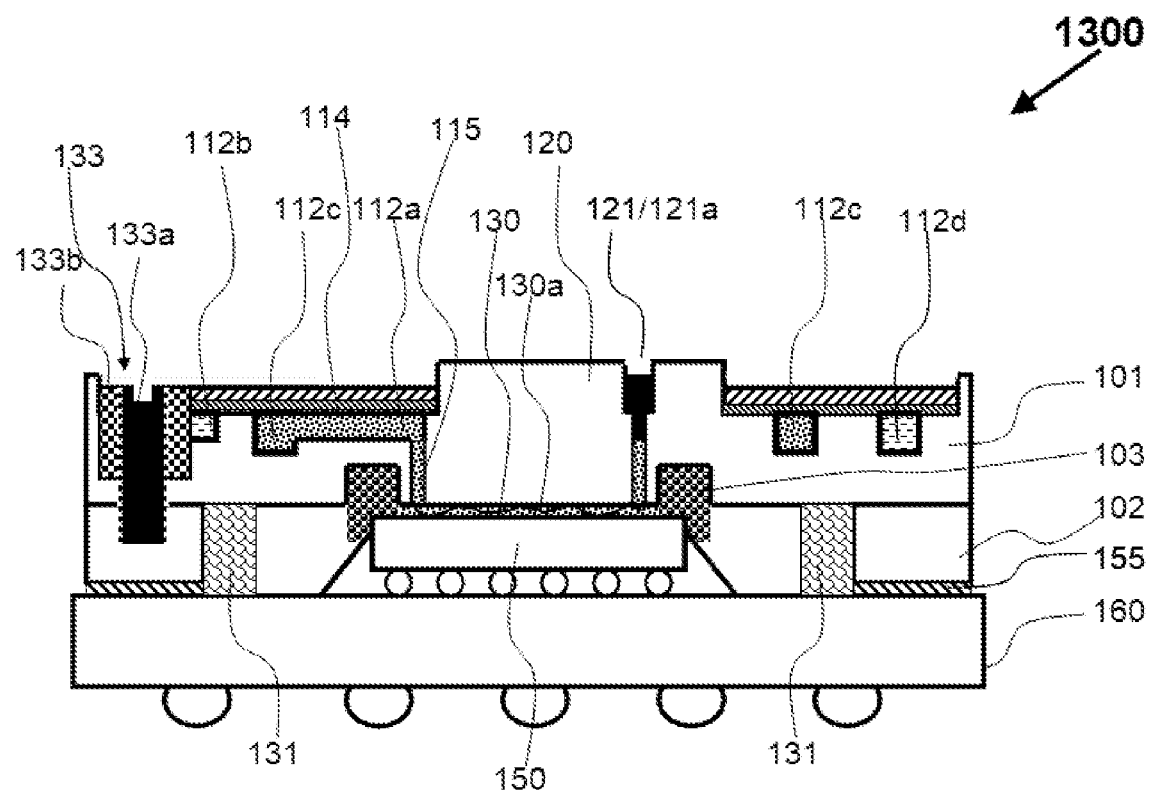
FIG. 4 and FIG. 4A are schematic diagrams for illustrating another plug structure for a storage tunnel, a thermally conductive mesh in the sealed gap as an option, and a foam block as a safety measure adjacent to the adhesive of a lid allowing for a lidded flip chip package to use a thermal interface material with fluidity of one embodiment of the present disclosure.
Figure 4A:
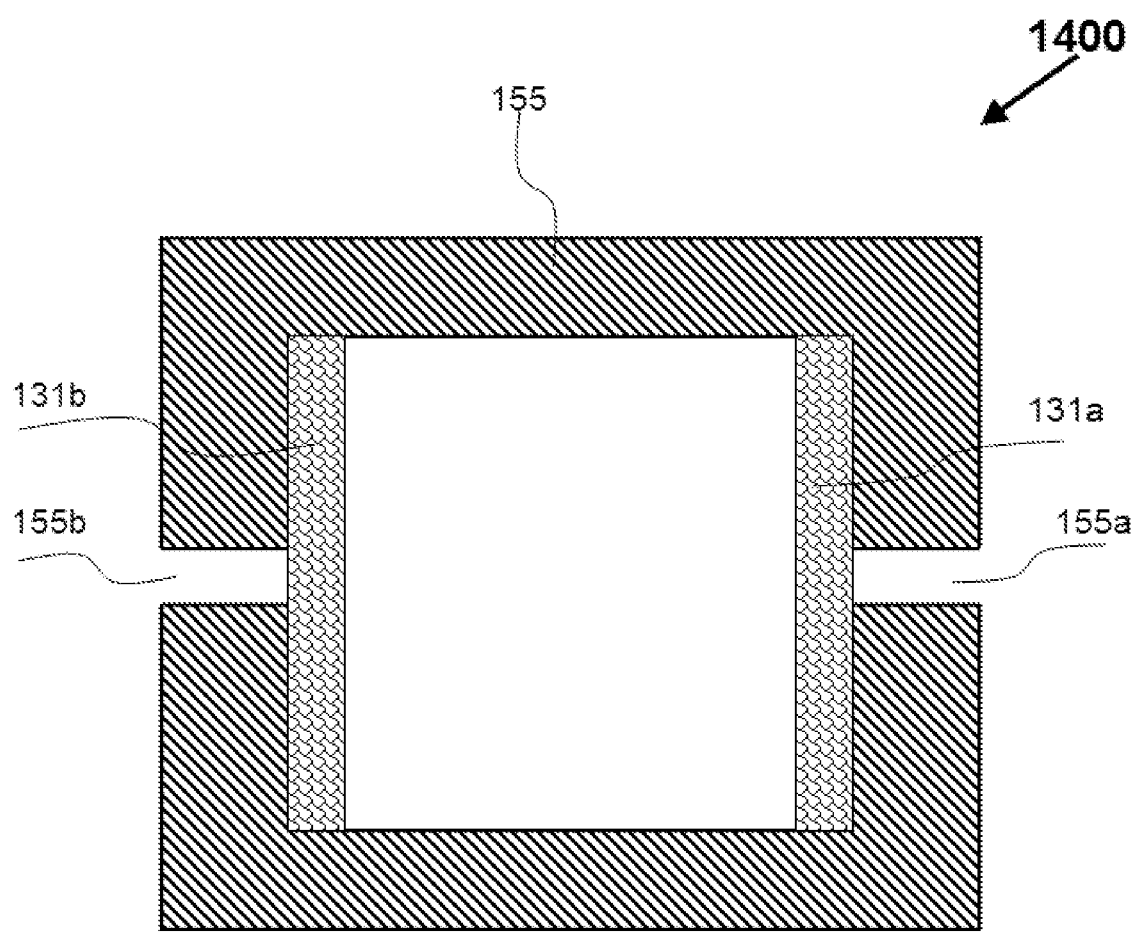

FIG. 4 and FIG. 4A are schematic diagrams for illustrating some further features including another design for a plug structure and a filter block as a safety measure of a lidded flip chip package of one preferred embodiment of the present disclosure. The numerical symbol 1300 in FIG. 4 designates a cross-sectional view of a lidded flip chip package, in which the numerical symbols 133, 133a and 133b designate another design for a plug structure, which includes a step hole 133, a headless screw 133a and a rubber tube 133b, wherein the rubber tube 133b is pushed out by the headless screw 133 to close the end 112a of the storage tunnel 112 when the headless screw 133 is driven into a small central hole of the rubber tube 133b. The numerical symbol 131 designates a filter block arranged adjacent to any openings at the adhesive 155 so that if a liquid metal would leak out from the sealed gap 130 into the cavity around the flip chip, the liquid metal would not easily flow out from the openings to the outside of the lid. The numerical symbol 130a designates a thermally conductive mesh in the sealed gap as an option. This mesh helps control the thickness of the gap as well as improve the thermal performance of the package. The numerical symbol 1400 in FIG. 4A designates a top view of the adhesive 155 and the filter block 131 as shown in FIG. 4, in which the 155a and 155b designates two example openings at the adhesive 155, and the 131a and 131b designates two filter blocks arranged adjacent to the openings. It is known that the adhesive 155 is usually not a closed loop so that the cavity around the flip chip 150 and between the lid and the substrate is not sealed. Otherwise, the air in the cavity may cause reliability issues due to a high pressure at a high temperature. The filter block 131 can also be a ring along the inner side of the adhesive, which can be flexibly designed depending on a specific application. Materials for the filter block 131 can include rubber foam, porous metal, or fiberglass mesh, which allow air in/out but does not allow a liquid metal in/out very easily.

Figure 5:
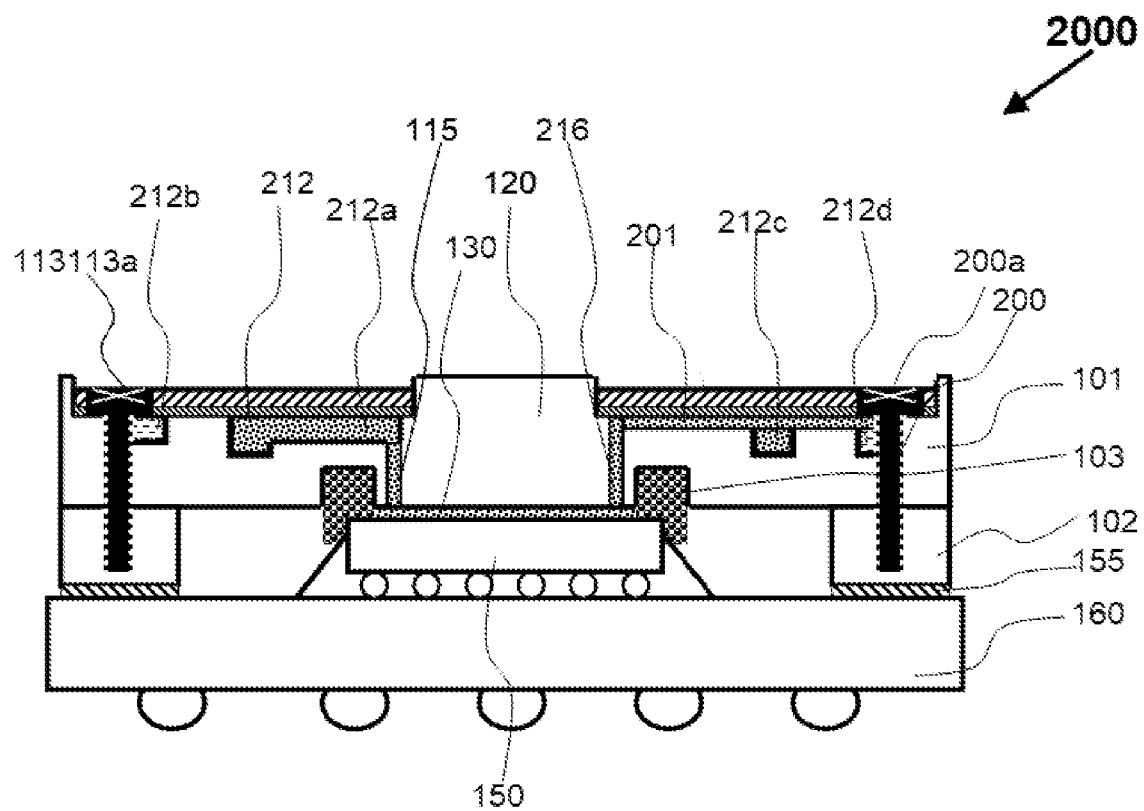
FIG. 5 to FIG. 5B are schematic diagrams for illustrating a preferred design for an injection hole of a lid allowing for a thermal interface material with fluidity in a lidded flip chip package of another preferred embodiment of the present disclosure.
Figure 5A:
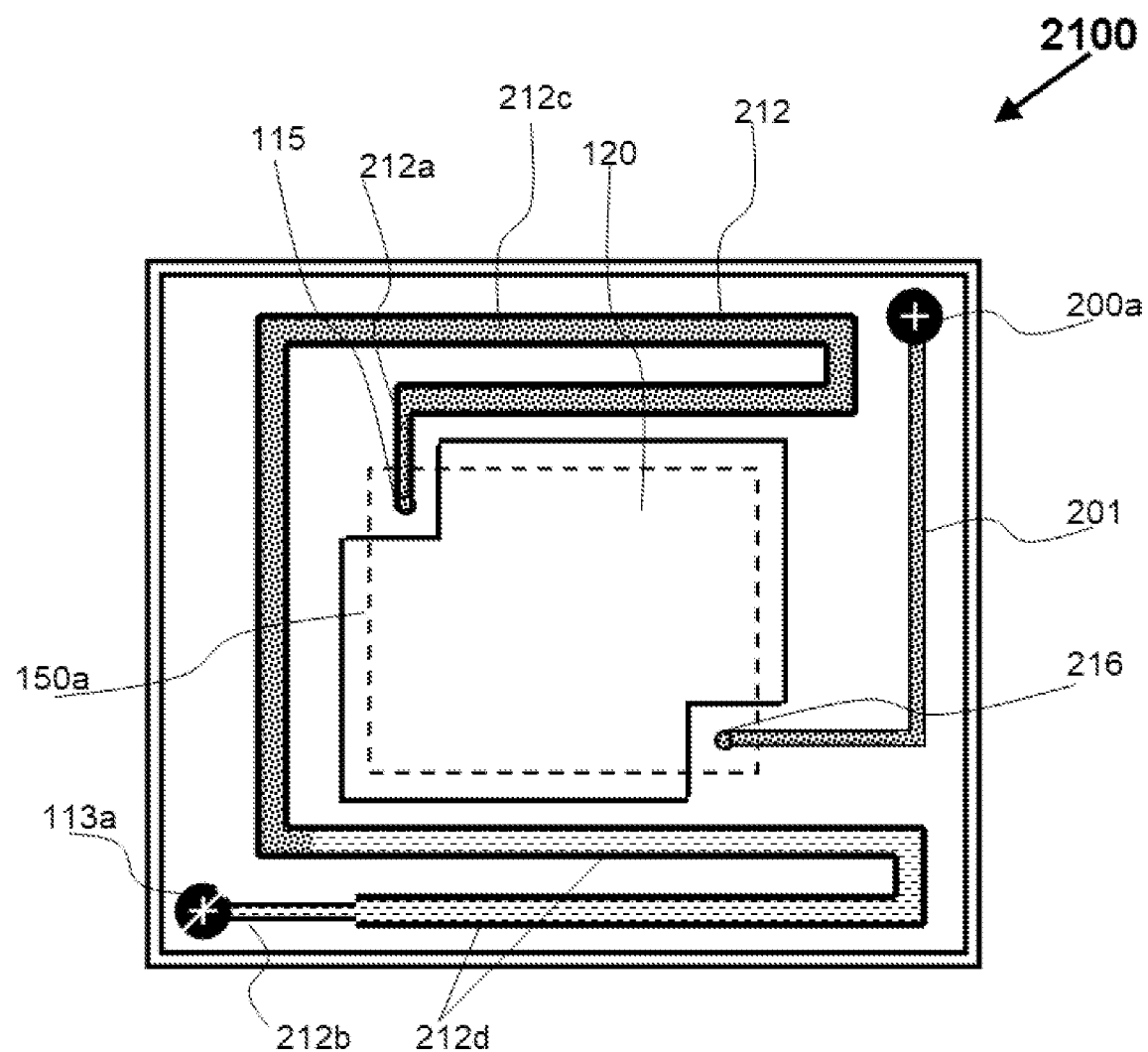
Figure 5B:
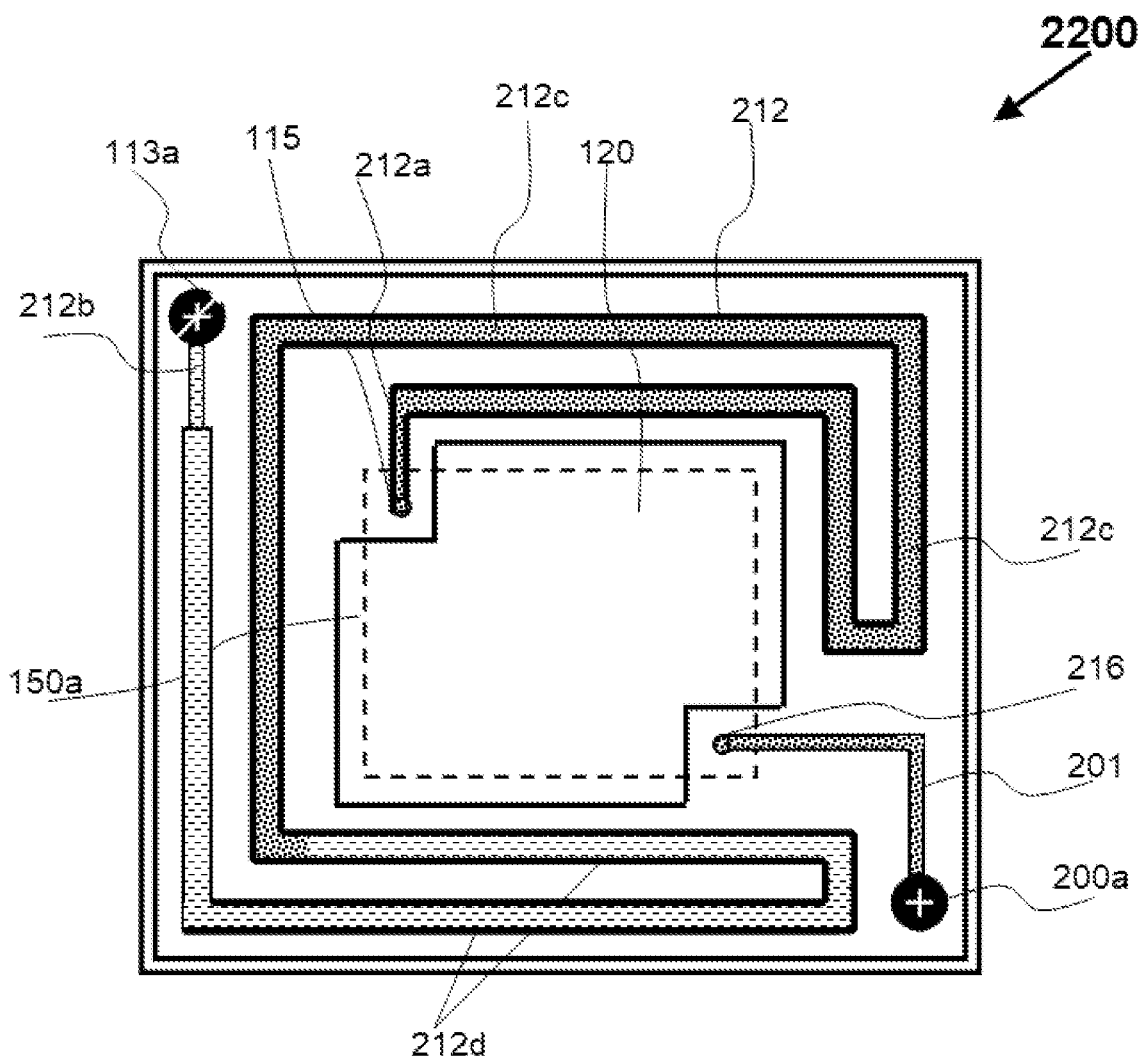

FIG. 5 to FIG. 5B are schematic diagrams for illustrating a preferred design for an injection hole of a lid allowing for a thermal interface material with fluidity in a lidded flip chip package of another preferred embodiment of the present disclosure, wherein an injection tunnel is introduced so that a plug structure at an outer end of the injection tunnel is used as an injection hole. It is seen that the injection hole 121 of the embodiments as shown in the previous drawings in FIG. 1 to FIG. 4 needs to be at a region directly above the flip chip and inside the sealing ring 103. An advantage of using an injection tunnel is that an injection hole can be flexibly designed so that it does not have to be directly above the flip chip and inside the sealing ring 103, but can be at any location, for example, at a corner location of the top piece and above the foot. The numerical symbol 2000 in FIG. 5 designates a cross-sectional view of a lidded flip chip package, in which the numerical symbols 200 and 200a designate a plug structure including a screw 200a in a screw hole 200 as an injection hole, which is arranged at a corner region of the lid and above the foot 102 so that the foot 102 can be further used for designing the plug structure, the numerical symbols 201 designates an injection tunnel which is formed in the ring-form cavity 110 as shown in FIG. 1 and is connected to the sealed gap through a connecting hole 216, the numerical symbol 212 designates a storage tunnel, the numerical symbols 212a and 212b designate two ends of the storage tunnel 212, and the 212c and 212d designate two portions of the storage tunnel 212, a portion 212c is filled with the same thermal interface material having fluidity as that in the sealed gap 130, and the remaining portion 112d is filled with a gas, the 212c and 212d also designate the thermal interface material having fluidity and the gas filled in the two portions, respectively. It is noted that since the storage tunnel 212 is also formed in the ring-form cavity 110, it needs to be rearranged to avoid crossing with the injection tunnel 201. An arrangement for the injection tunnel 201 and the storage tunnel 212 is described in FIG. 5A, in which the same numerical symbols as those in FIG. 5 designate the top views of the same elements, and are not repeatedly described. It is noted that a storage tunnel and an injection tunnel can be flexibly designed according to the sizes of a flip chip and a substrate of a flip chip package in a specific application, an example has been illustrated in FIG. 5A, and another example is illustrated in FIG. 5B, in which the same numerical symbols are used to designate the same elements, and are not repeatedly described. It is noted that the patterns for a storage tunnel and an injection tunnel can be flexibly designed, and a basic rule for designing the two tunnels is that the length of the storage tunnel needs to be designed so that its volume is big enough to accommodate the volume change of the sealed gap, while the injection tunnel is only for flexibly determining a location for the injection hole and its volume is not important. It is also noted that the width and depth of a storage tunnel are not limited to be uniform, but can be flexibly designed. For example, the storage tunnel can be designed thinner near its outer end so that it can be more easily closed by a plug structure.

Figure 6:
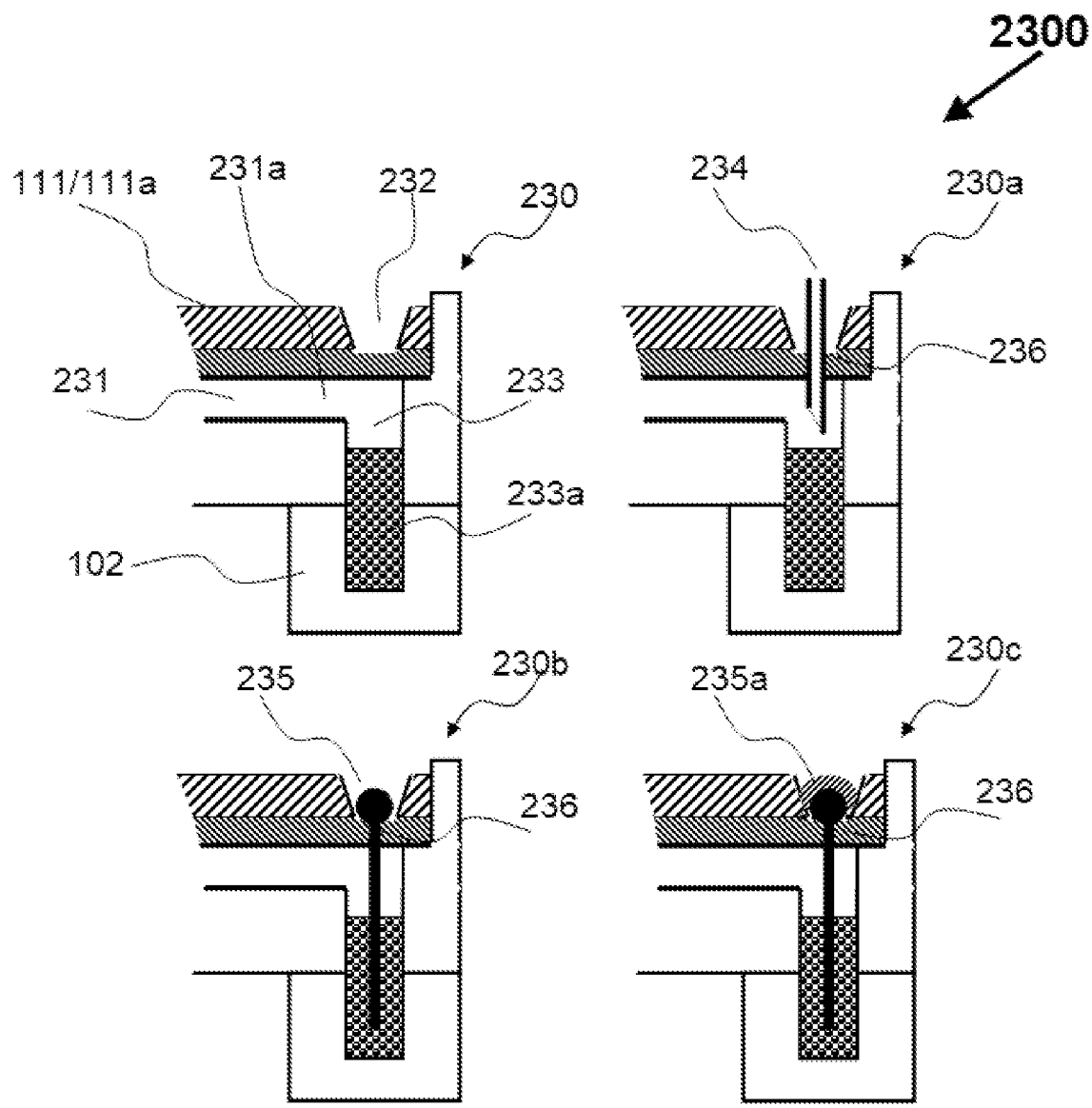
FIG. 6 is a schematic diagram for illustrating a preferred design for a plug structure for opening or closing a storage tunnel or an injection hole of a lid allowing for a lidded flip chip package to use a thermal interface material with fluidity of one preferred embodiment of the present disclosure.

It is noted that some designs for a plug structure have been described previously in conjunction with the drawings in FIG. 1 to FIG. 4. Because a liquid metal and a gas is sealed in the sealed gap and the storage tunnel of a lidded flip chip package in its application as a preferred option, the reliability of a plug structure is also important in addition to its ease of usage. FIG. 6 is a schematic diagram for illustrating a preferred design for a plug structure for opening or closing a storage tunnel or an injection hole of a lid allowing for a lidded flip chip package to use a thermal interface material with fluidity of one preferred embodiment of the present disclosure. The numerical symbol 2300 in FIG. 6 designates a cross-sectional view of a plug structure, comprising: a hole extending down from the outer end of the storage or injection tunnel into the foot, a locking material arranged in a lower portion of the hole, and a pin with a head, wherein the pin goes through the covering piece with its tip portion being inserted into the locking material and its head being kept above the covering piece for sealing a tiny hole which is pre-formed through the covering piece or formed when the pin goes through the covering piece. The numerical symbol 2300 in FIG. 6 designates a cross-sectional view of a plug structure, in which the numerical symbol 230 designates a structure at an outer end 231*a* of a storage or injection tunnel 231, the 232 designates a point type of notch in a covering piece 111/111*a* as an option, the 233 designates a hole extending down from the outer end 231*a* into the foot 102, and 233*a* designates a locking material, like a rubber, arranged in a lower portion of the hole 233; the numerical symbol 230*b* illustrates a pin 235 with a head as a plug that goes through the covering piece 111/111*a* with its tip portion inserted into the locking material 233*a* and its head kept above the covering piece to seal a tiny hole 236 which is pre-formed in the covering piece 111/111*a* or formed when the pin goes through the covering piece 111/111*a*; the numerical symbol 230*c* illustrates that the head of the pin 235 also includes an adhesive layer 235*a* to better seal the tiny hole 236; and the numerical symbol 230*a* illustrates that after the pin 235 is removed to open the outer end 231*a* of the tunnel 231 to an ambient outside the lid, a syringe needle 234 can be inserted into the tiny hole 236 to inject a liquid if the plug structure is for an injection hole. It is noted that after the pin 235 is removed to open the outer end 231*a* of the tunnel 231 as a storage tunnel, a desired gas with a desired gas pressure can be arranged into a storage tunnel by setting an ambient condition, which will be further described below.

Figure 7:
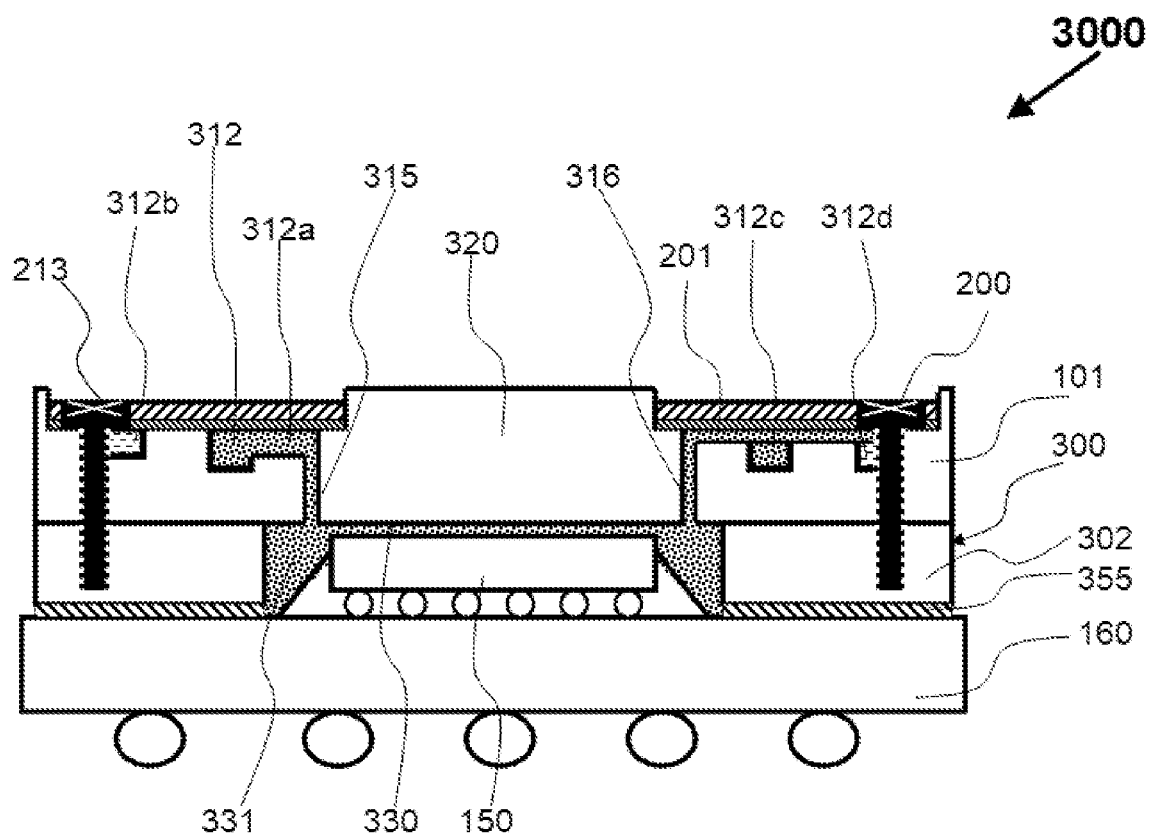
FIG. 7 and FIG. 8 are schematic diagrams for illustrating a foot structure being used as a sealing ring of a lid allowing for a lidded flip chip package to use a thermal interface material with fluidity of one preferred embodiment of the present disclosure.

FIG. 7 is a schematic diagram for illustrating another preferred design for a sealing ring of a lidded flip chip package of one preferred embodiment of the present disclosure, wherein the foot is a ring-form of foot along a peripheral region at a lower side of the top piece, an adhesive is completely interposed between the foot and the substrate for bonding the lid on the substrate through the foot, the ring-form of foot with the adhesive also forms a sealing ring around the flip chip so as to form a sealed gap between the lid and the flip chip, and the sealed gap also includes a cavity around the flip chip and between the lid and the substrate. The numerical symbol 3000 in FIG. 7 designates a cross-sectional view of a lidded flip chip package of one preferred embodiment of the present disclosure, in which the numerical symbol 300 designates a sealing ring consisting of a ring-form of foot 302 and an adhesive 355 which is completely interposed between the foot 302 and the substrate 160 for bonding the lid on the substrate, the numerical symbols 330 and 331 designate a sealed gap between the top piece 101 of the lid and the flip chip 150, which also includes a cavity 331 around the flip chip 150, the numerical symbol 312 designates a storage tunnel, the numerical symbols 312*a* and 312*b* designate two ends of the storage tunnel 312, and the 312*c* and 312*d* designate two portions of the storage tunnel 312, a portion 312*c* is filled with the same thermal interface material having fluidity as that in the sealed gap 330 and 331, and the remaining portion 312*d* is filled with a gas, the 312*c* and 312*d* also designate the thermal interface material having fluidity and the gas filled in the two portions, the numerical symbols 201 and 200 designates an injection tunnel and a plug structure for an injection hole similar as those described in FIG. 5, the numerical symbol 315 designates a connecting hole for connecting the storage tunnel 312 with the sealed gap 330 and 331, and the numerical symbol 316 designates another connecting hole for connecting the injection tunnel 201 with the sealed gap 330 and 331. It is noted that a benefit to use a sealing ring outside the flip chip 150, like the foot 302 with the adhesive 355, is that the connecting holes 315 and 316 can be arranged not to be right above the flip chip 150, so that the island portion 320 of the top piece can be designed as large as possible and a plug structure 200 for an injection hole can be placed outside the island portion 320 so that it doesn't affect the heat dissipation from the flip chip to ambient.

Figure 8:
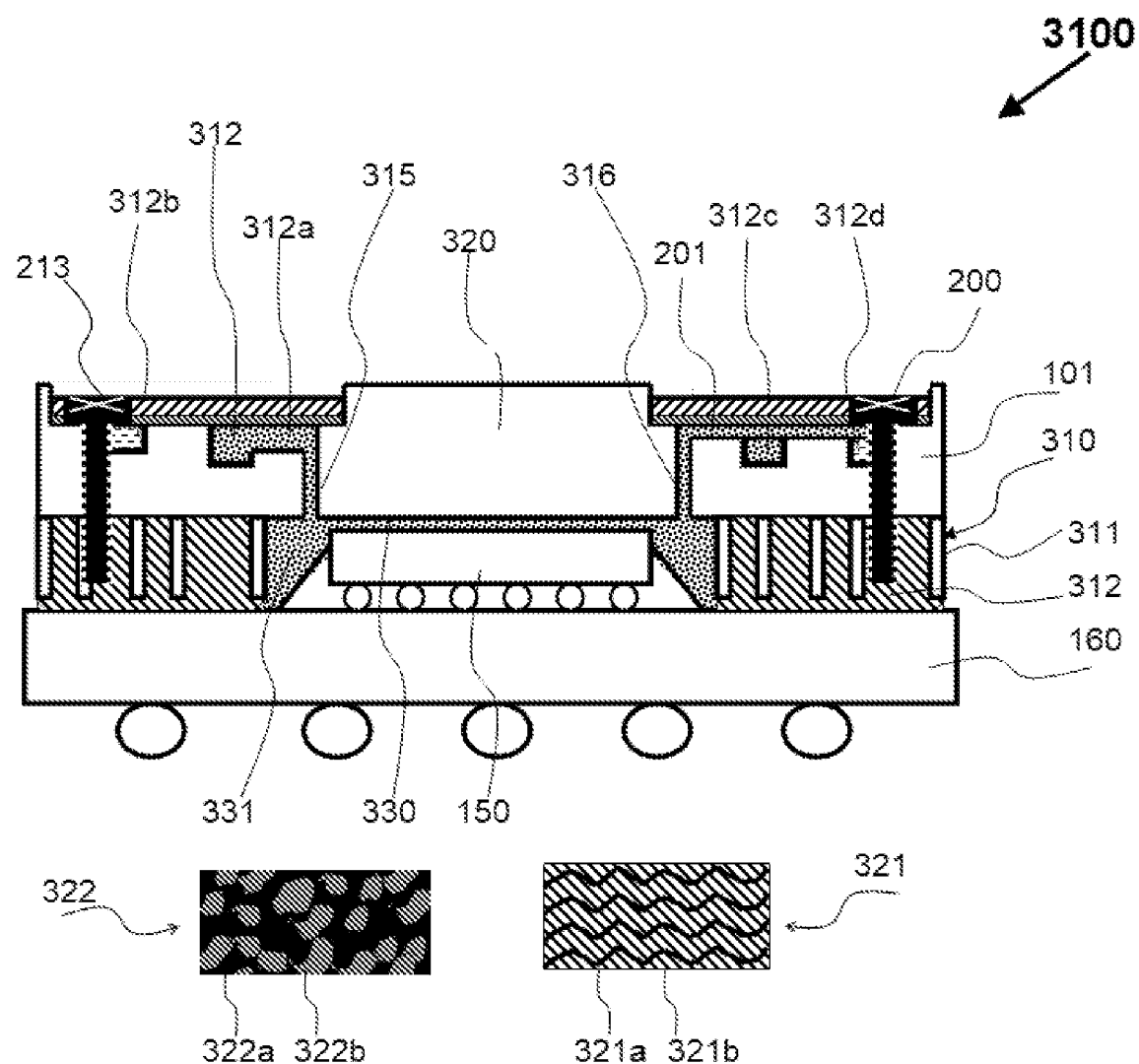

FIG. 8 is a schematic diagram for illustrating another preferred design for a foot of a lidded flip chip package of one preferred embodiment of the present disclosure, wherein the foot consists of a plurality of pins filled with an adhesive among them, a piece of porous material impregnated with an adhesive or resin, or a piece of mesh impregnated with an adhesive or resin. The numerical symbol 3100 in FIG. 8 designates a cross-sectional view of a lidded flip chip package of one preferred embodiment of the present disclosure, in which the numerical symbol 310 designates a foot consisting of a plurality of pins 311 filled with an adhesive or resin 312, the adhesive or resin 312 is also used to bond the lid on the substrate, the numerical symbol 322 designates a foot consisting of a piece of porous material 322*a* impregnated with an adhesive or resin 322*b*, and the numerical symbol 321 designates a foot consisting of a piece of mesh 321*a* impregnated with an adhesive or resin 321*b*. It is noted that the various foot structures 310, 321 or 322 can be also used as a sealing ring as shown in FIG. 8 or only used as a foot to bond the lid on the substrate as shown in the previous drawings in FIG. 1 to FIG. 5.

Figure 9:
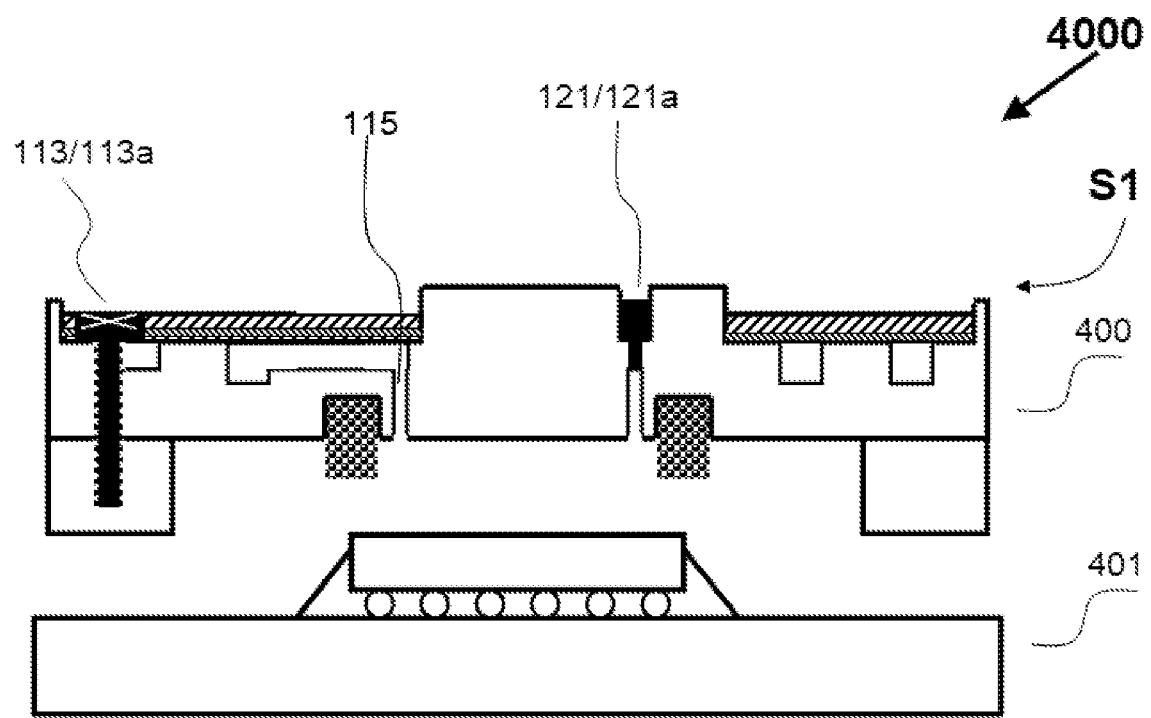
FIG. 9 to FIG. 12 are schematic diagrams for illustrating a method for making a lidded flip chip package based on a lid of one preferred embodiment of the present disclosure.
Figure 10:
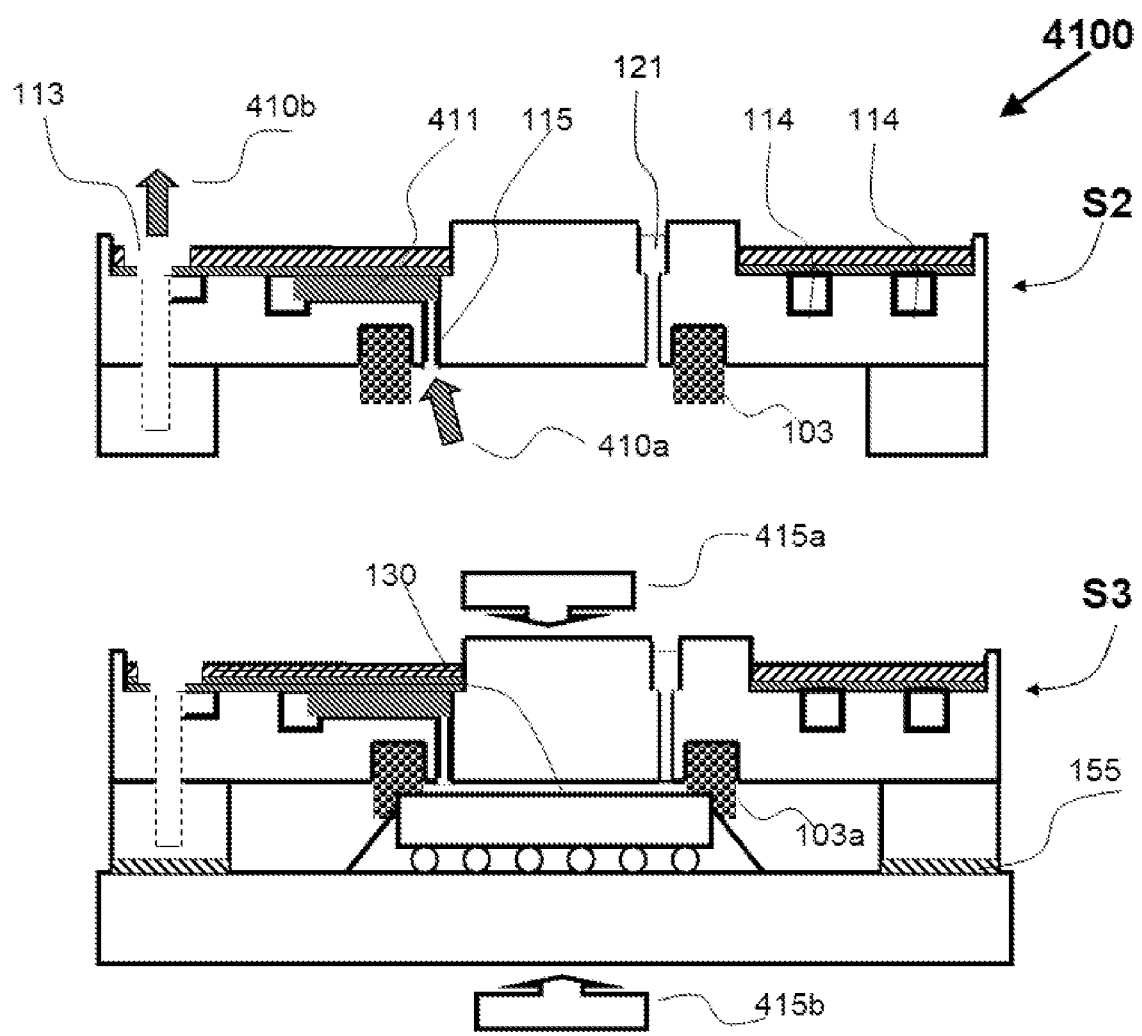
Figure 11:
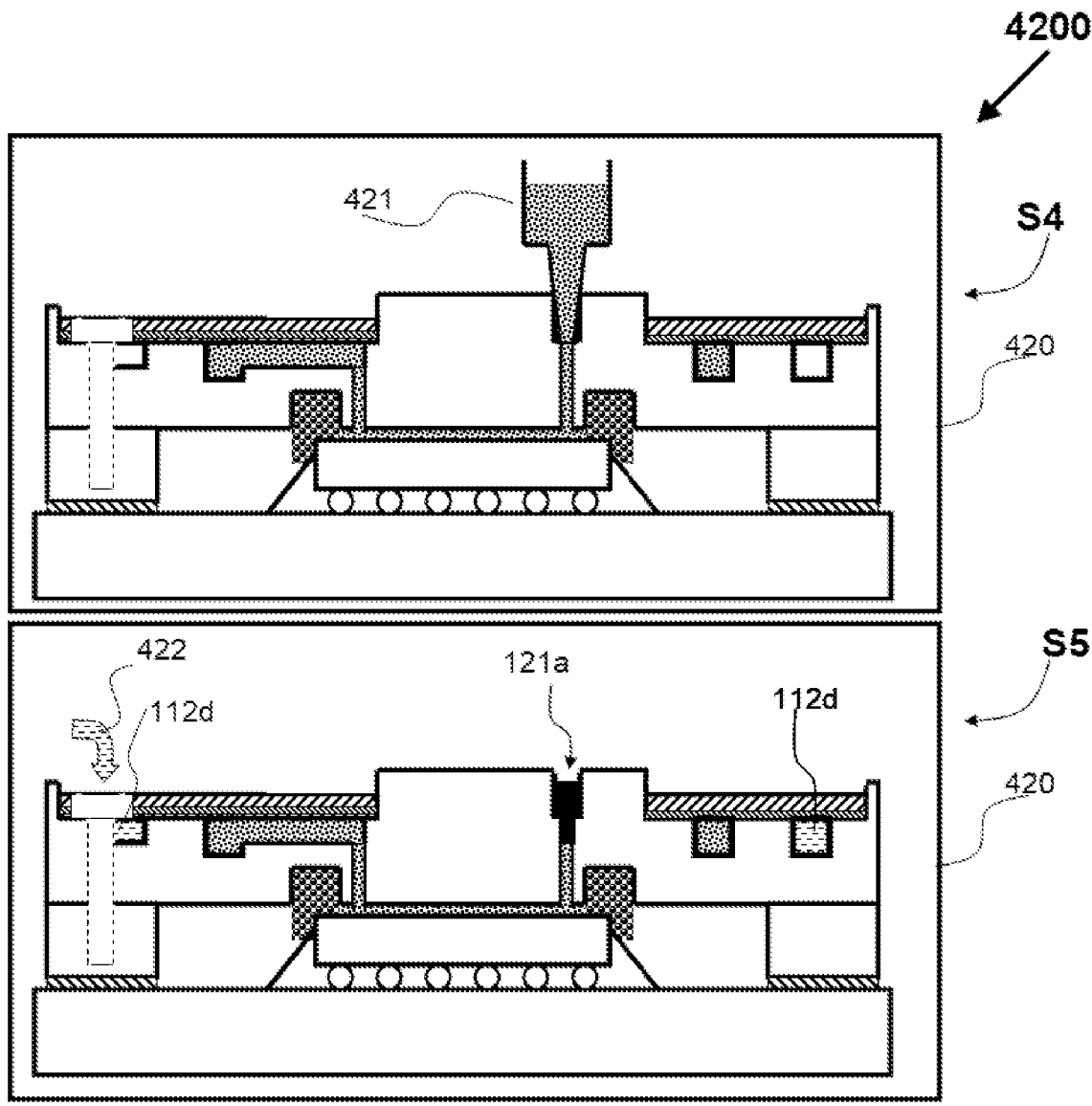
Figure 12:
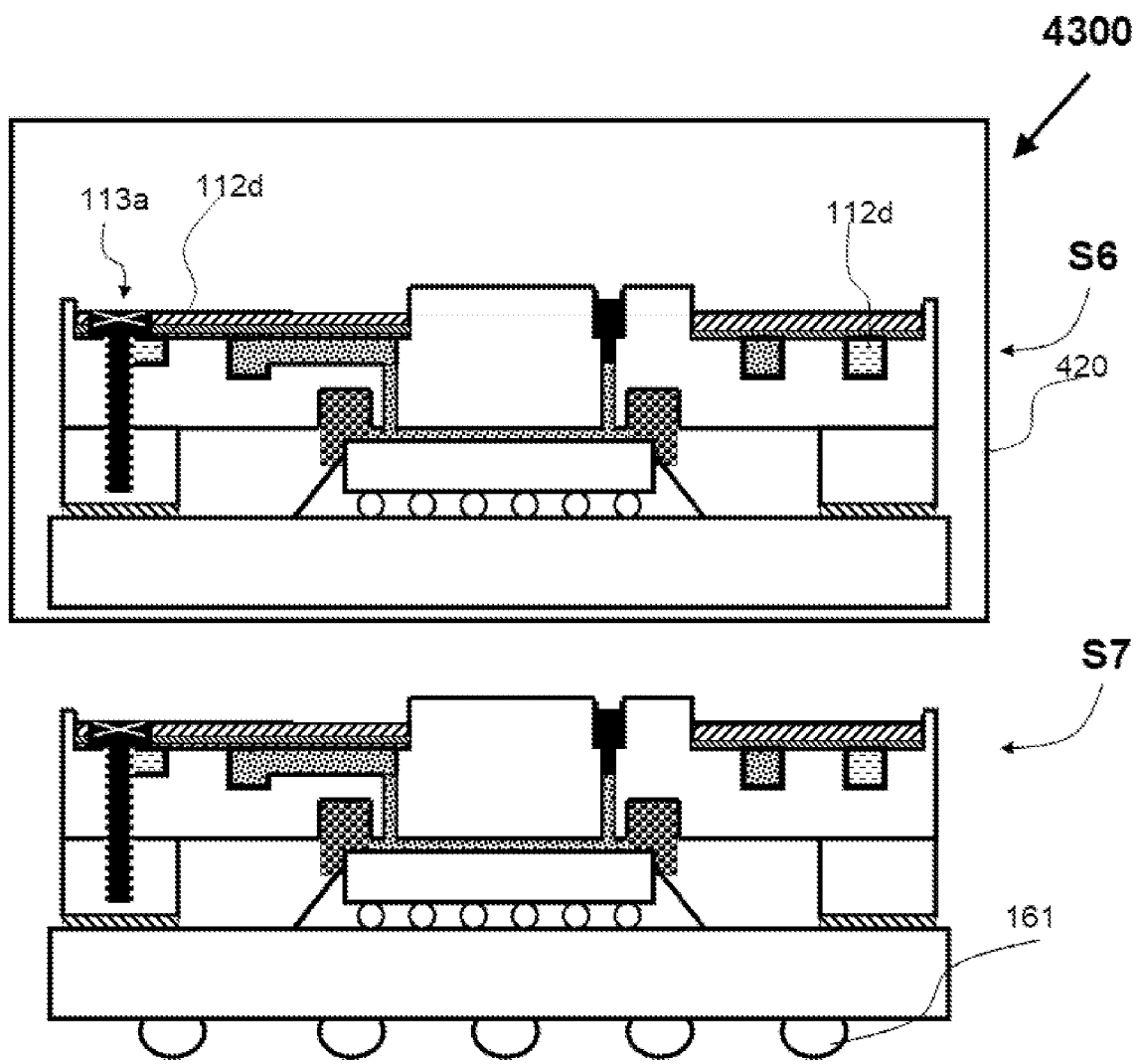

FIG. 9 to FIG. 12 are schematic diagrams for illustrating a method for making a lidded flip chip package as shown in FIG. 1A or similarly for making a lidded flip chip package as shown in FIG. 5, FIG. 7 or FIG. 8 of one preferred embodiment of the present disclosure. The method comprises the following major steps 1 to 7 as illustrated by FIG. 9 for Step 1, FIG. 10 for Steps 2 and 3, FIG. 11 for Steps 4 and 5, and FIG. 12 for Steps 6 and 7, which are described in the following:

The numerical symbols 4000 and S1 in FIG. 9 are for illustrating Step 1:

1) Prepare a lid 400 according to a flip chip package 401, the lid (referring to FIG. 1 and FIG. 1A for its description) includes: a top piece with an upper side and a lower side, a foot at the lower side of the top piece, a ring-form of cavity with a bottom at the upper side of the top piece, a covering piece, a storage tunnel as a reservoir, a plug structure 113/113*a* at an outer end of the storage tunnel, another plug structure including an injection hole 121 and a plug 121*a*, and a sealing ring; wherein the sealing ring is mounted at the lower side of the top piece; wherein a pattern of notch is formed at the bottom of the ring-form of cavity, and the covering piece is placed in the ring-form of cavity so as to cover the pattern of notch and form the storage tunnel; wherein a connecting hole has one end at the lower side of the top piece and inside the sealing ring, and has another end connected to one end of the storage tunnel; and wherein another end of the storage tunnel is mounted with the plug structure 113/113*a*;

The numerical symbols 4100 and S2 in FIG. 10 are for illustrating Step 2:

2) Open the storage tunnel and the injection hole by removing the plug 113*a* and the plug 121*a* respectively, and then fill an amount of lubricant oil 411 into the storage tunnel from the connecting hole 115 as illustrated by the arrow 410*a*, or use a lubricant oil to wash the storage tunnel from the connecting hole 115 as illustrated by the pair of arrows 410*a* and 410*b* so as to form a slippery skin 114 on an inner surface of the storage tunnel;

The numerical symbols 4100 and S3 in FIG. 10 are for illustrating Step 3:

3) Mount the lid on the substrate and over the flip chip, wherein an adhesive 155 is interposed between the foot and the substrate and a clamping force as illustrated by the pair of arrows 415*a* and 415*b* is applied so that the adhesive bonds the lid with the substrate at a curing temperature and the sealing ring 103*a* is tightly compressed to seal a peripheral edge region at a top surface of the flip chip and form a sealed gap 130 between the flip chip and the top piece of the lid;

The numerical symbols 4200 and S4 in FIG. 11 are for illustrating Step 4:

4) Put the assembly formed in Step 3 into a vacuum oven or container 420 and set it to a vacuum condition to degas the assembly, and then fill a liquid metal into the sealed gap and a portion of the storage tunnel from the injection hole, as illustrated by the syringe tip 421;

The numerical symbols 4200 and S5 in FIG. 11 are for illustrating Step 5:

5) Close the injection hole by putting back the plug 121*a* during vacuum condition first, and then put a desired gas with a desired gas pressure into the vacuum oven or container 420 to fill the remaining portion of the storage tunnel with the gas 112*d*, as illustrated by the arrow 422;

The numerical symbols 4300 and S6 in FIG. 12 are for illustrating Step 6:

6) Close the storage tunnel by putting back the plug 113*a* so that the gas 112*d* is sealed inside the storage tunnel;

The numerical symbols 4300 and S7 in FIG. 12 are for illustrating Step 7:

7) Mount solder balls 161 at a bottom side of the substrate so that a lidded flip chip package as illustrated in FIG. 1A is formed.

Figure 13:
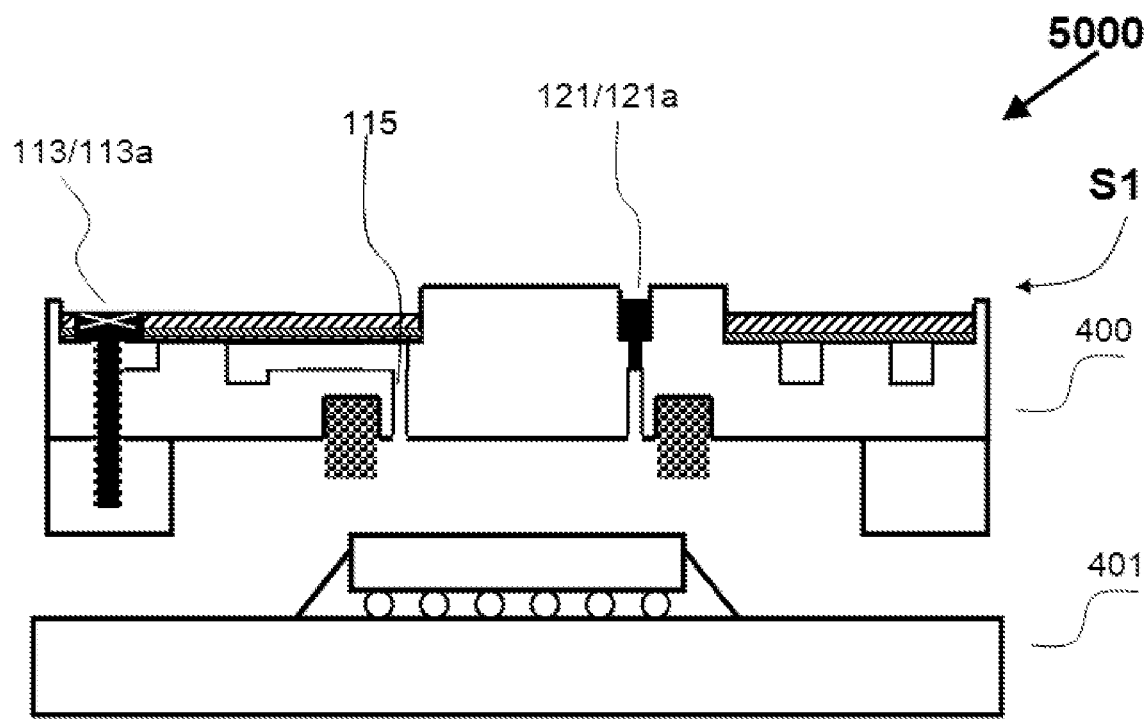
FIG. 13 to FIG. 17 are schematic diagrams for illustrating a method for making a lidded flip chip package based on a lid of another preferred embodiment of the present disclosure.
Figure 14:
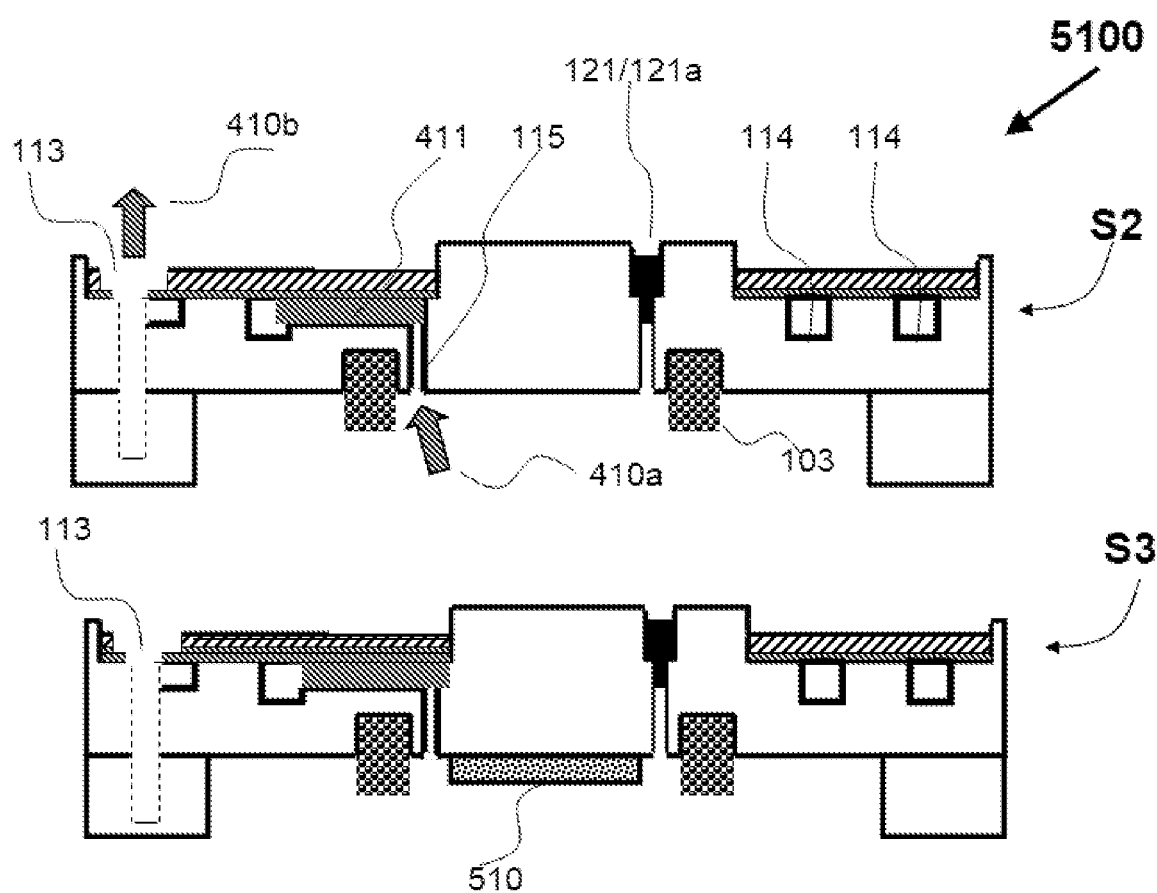
Figure 15:
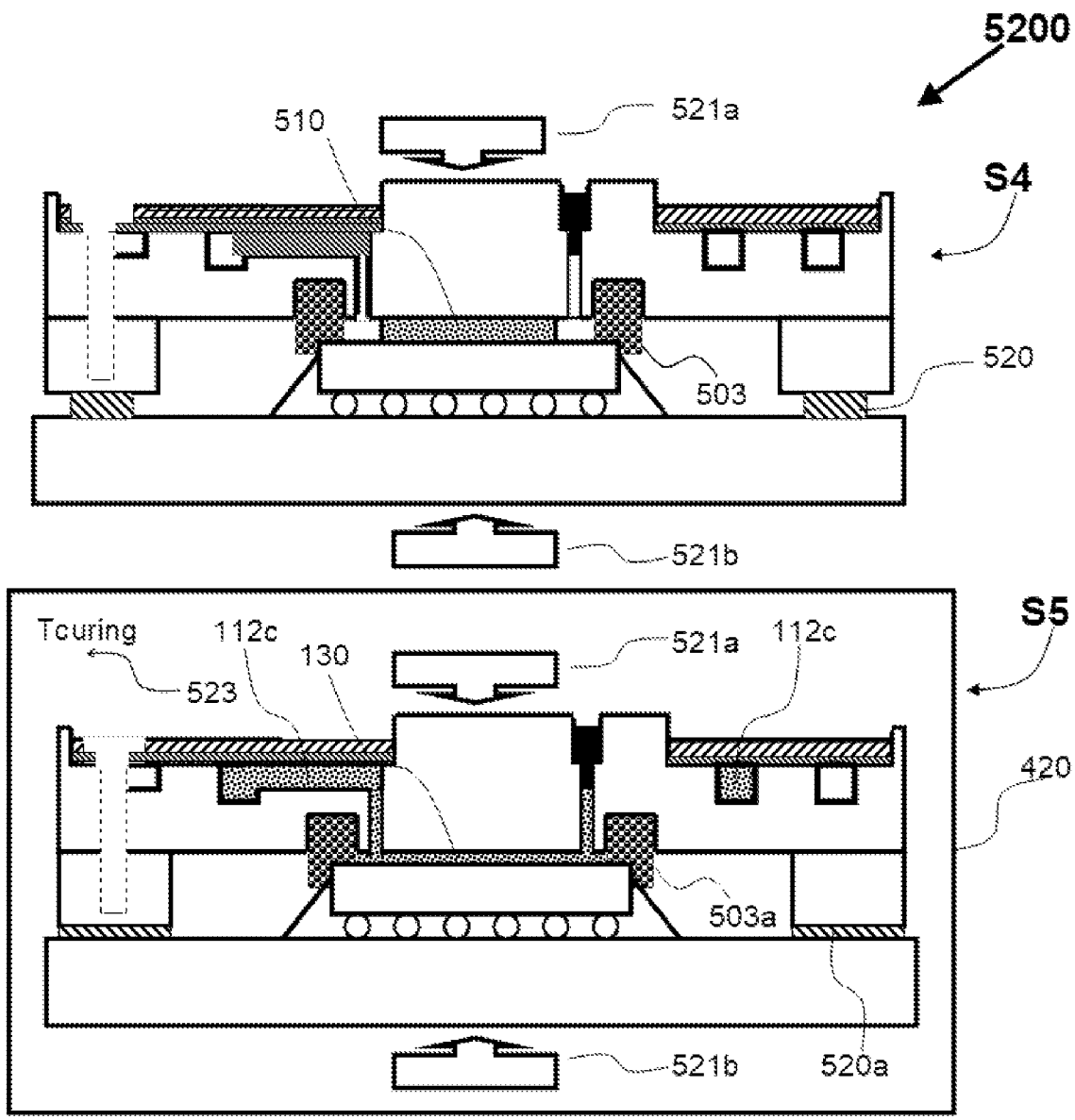
Figure 16:
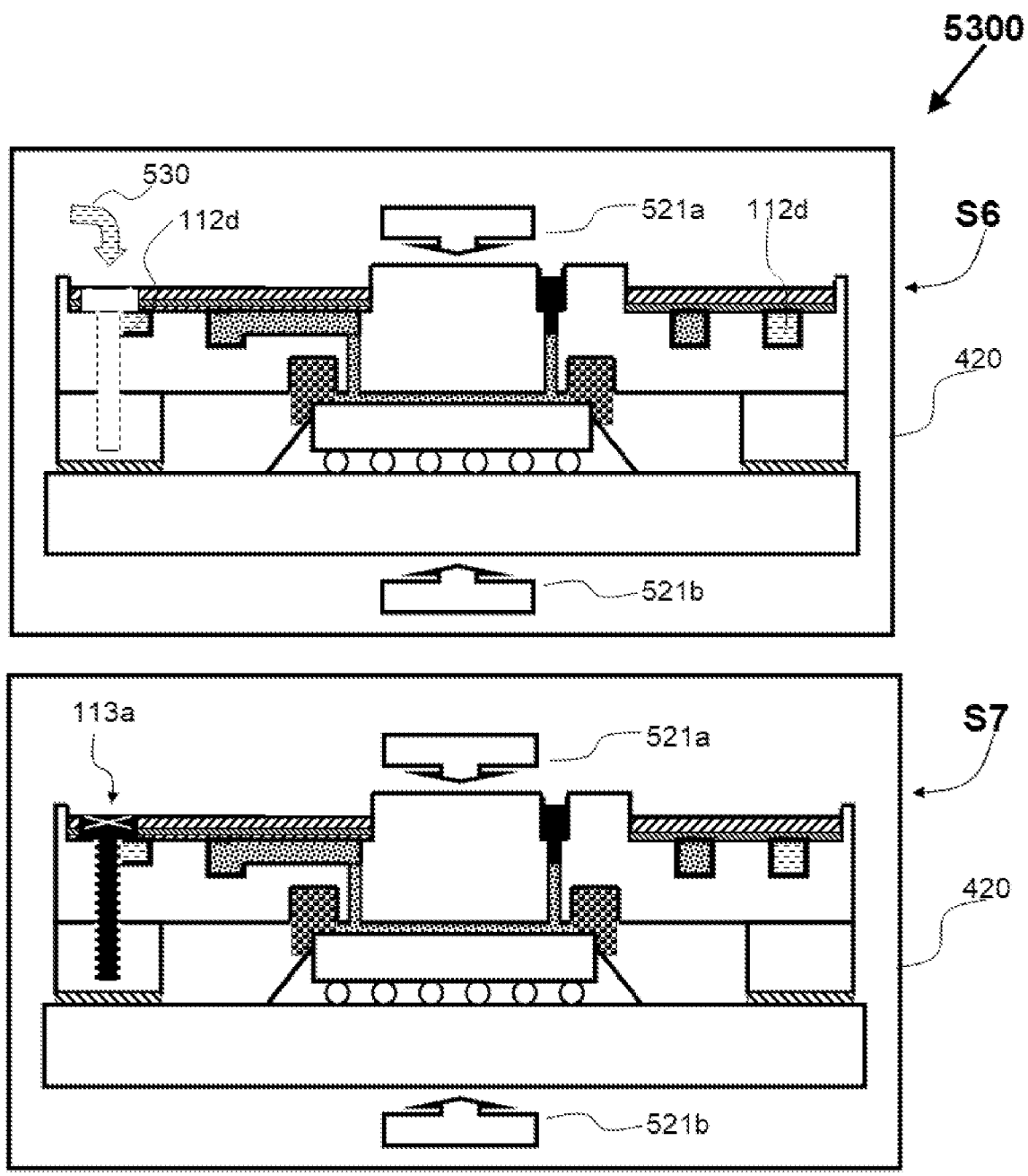
Figure 17:
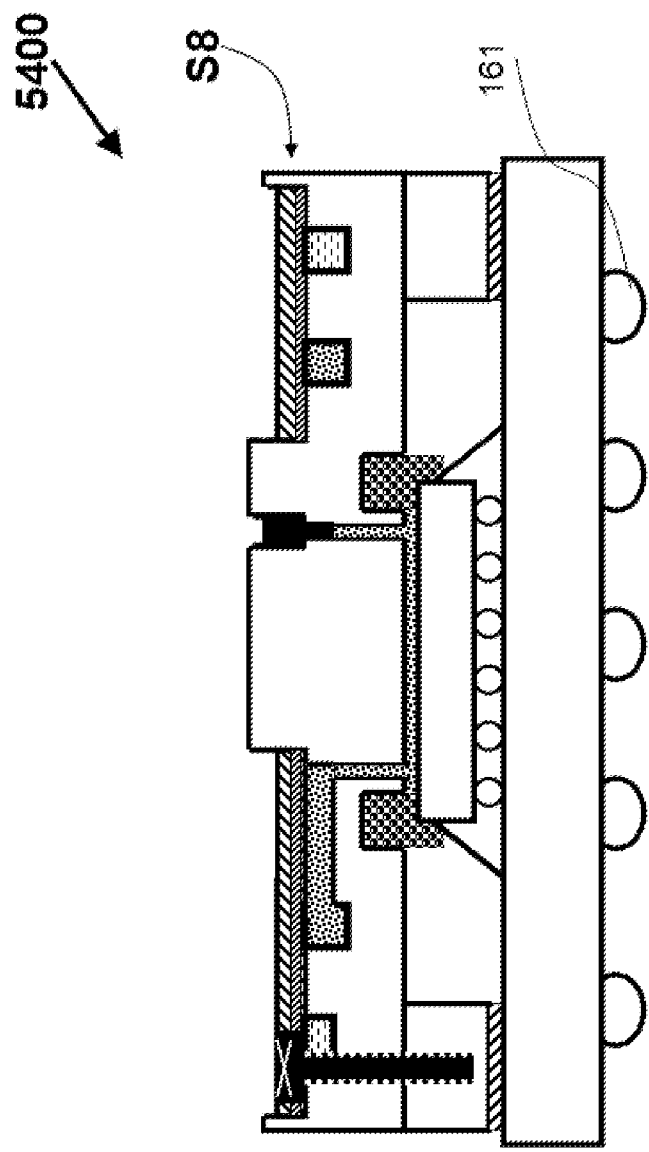

FIG. 13 to FIG. 17 are schematic diagrams for illustrating another method for making a lidded flip chip package as shown in FIG. 1A or similarly for making a lidded flip chip package as shown in FIG. 5, FIG. 7 or FIG. 8 of one preferred embodiment of the present disclosure. The method comprises the following major steps 1 to 8 as illustrated by FIG. 13 for Step 1, FIG. 14 for Steps 2 and 3, FIG. 15 for Steps 4 and 5, FIG. 16 for Steps 6 and 7, and FIG. 17 for Step 8, which are described in the following:

The numerical symbols 5000 and S1 in FIG. 13 are for illustrating Step 1:

1) Prepare a lid 400 according to a flip chip package 401, the lid (referring to FIG. 1 and FIG. 1A for its description) includes: a top piece with an upper side and a lower side, a foot at the lower side of the top piece, a ring-form of cavity with a bottom at the upper side of the top piece, a covering piece, a storage tunnel as a reservoir, a plug structure 113/113*a* at an outer end of the storage tunnel, another plug structure including an injection hole 121 and a plug 121*a*, and a sealing ring; wherein the sealing ring is mounted at the lower side of the top piece; wherein a pattern of notch is formed at the bottom of the ring-form of cavity, and the covering piece is placed in the ring-form of cavity so as to cover the pattern of notch and form the storage tunnel; wherein a connecting hole has one end at the lower side of the top piece and inside the sealing ring, and has another end connected to one end of the storage tunnel; and wherein another end of the storage tunnel is mounted with the plug structure 113/113*a*;

The numerical symbols 5100 and S2 in FIG. 14 are for illustrating Step 2:

2) Open the storage tunnel by removing the plug 113*a*, and then fill an amount of lubricant oil 411 into the storage tunnel from the connecting hole 115 as illustrated by the arrow 410*a*, or use a lubricant oil to wash the storage tunnel from the connecting hole 115 as illustrated by the pair of arrows 410*a* and 410*b* so as to form a slippery skin 114 on an inner surface of the storage tunnel;

The numerical symbols 5100 and S3 in FIG. 14 are for illustrating Step 3:

3) Attach a piece of pre-formed liquid metal pad 510 or form a liquid metal pad 510 at a bottom surface of the top piece and inside the sealing ring under a low temperature; wherein the liquid metal pad is in a solid state due to the low temperature;

The numerical symbols 5200 and S4 in FIG. 15 are for illustrating Step 4:

4) Clamp the lid formed in Step 3 onto the flip chip package prepared in Step 1 using a clamping force as illustrated by the pair of arrows 521*a* and 521*b*, wherein an adhesive 520 is interposed between the foot of the lid and the substrate, the sealing ring 503 is compressed to seal at a peripheral edge region at a top surface of the flip chip and form a sealed gap between the lid and flip chip, and the liquid metal pad 510 is clamped between the lid and the flip chip and enclosed in the sealed gap;

The numerical symbols 5200 and S5 in FIG. 15 are for illustrating Step 5:

5) Put the assembly formed in step 4 into a vacuum oven or container and set it to a vacuum condition to degas the assembly, and then raise the oven temperature above the melting point of the liquid metal and hold this temperature for a period of time until the liquid metal pad becomes molten, so that the seal ring is further compressed, the thickness of the of the sealed gap becomes thinner, the adhesive is compressed to spread between the foot and the substrate, and the molten liquid metal pad is squeezed to fill the sealed gap and a portion of the storage tunnel; and then raise the oven temperature to a curing temperature of the adhesive and hold it until the adhesive becomes cured;

The numerical symbols 5300 and S6 in FIG. 16 are for illustrating Step 6:

6) Put a desired gas with a desired gas pressure as illustrated by the arrow 530 into the vacuum oven or container 420 to fill the remaining portion of the storage tunnel 112*d* with the gas;

The numerical symbols 5300 and S7 in FIG. 16 are for illustrating Step 7:

7) Close the storage tunnel by putting back the plug 113*a* so that the gas 112*d* is sealed inside the storage tunnel;

The numerical symbols 5400 and S8 in FIG. 17 are for illustrating Step 8:

8) Mount solder balls 161 at a bottom side of the substrate so that a lidded flip chip package as illustrated in FIG. 1A is formed.

It is noted that the step 2 for forming a slippery skin on an inner surface of the storage tunnel in the previously described methods for making a lidded flip chip package can be avoided if an inert gas is used in the storage tunnel. It is also noted that a benefit of using a plug structure at an outer end of the storage tunnel is that a desired gas, like an inert gas including nitrogen and helium can be sealed in the storage tunnel to avoid an oxidation of a liquid metal in the storage tunnel, and the gas pressure can be designed to improve the flow of the liquid metal. Furthermore, even if a natural air is used in the storage tunnel, the oxygen will be quickly exhausted due to oxidation with the liquid metal in the storage tunnel, and the oxidation of the liquid metal will not accumulate to cause a severe issue. Another usage of a pair of plug structures for the injection hole and the storage tunnel is to withdraw out the liquid metal from the sealed gap and the storage tunnel by opening the storage tunnel and the injection hole, which may be needed when using a cross-sectional cut at the lidded flip chip package to perform a failure analysis. However, it is seen from the descriptions for the method illustrated in FIG. 13 to FIG. 17 that when a preformed liquid metal pad is used, the injection hole is not used for making the lidded flip chip package. So, if the liquid metal doesn't need to be withdrawn out from the sealed gap and the storage tunnel, the injection hole can be avoided.

Although the present disclosure is described in some details for illustrative purposes with reference to the specific embodiments and drawings, it is apparent that many other modifications and variations may be made without departing from the spirit and scope of the present invention.

What is claimed is:

1. A lid allowing for a thermal interface material with fluidity in a lidded flip chip package, comprising:
    a top piece with an upper side and a lower side, a foot at the lower side of the top piece, a reservoir structure including a storage tunnel, an injection tunnel, a sealing ring, and a plug structure including a hole and a plug;
    wherein the sealing ring is mounted at the lower side of the top piece, which seals a peripheral edge region at a top surface of a flip chip and/or seals a peripheral region around a flip chip and at a top surface of a substrate so as to form a sealed gap between the flip chip and the top piece;
    wherein the lid further includes a ring-form of cavity at the upper side of its top piece and an island as a portion of the top piece which is surrounded by the ring-form of cavity, a pattern of notch formed at a bottom of the ring-form of cavity, and a covering piece mounted in the ring-form of cavity so as to cover the pattern of notch and form the storage tunnel and the injection tunnel;
    wherein the storage tunnel has two ends, one end, called inner end herein of the said two ends connects to the sealed gap through a connecting hole, the plug structure is formed at the other end, called outer end herein of the said two ends;
    wherein the injection tunnel has two ends, one end, called inner end herein of the said two ends connects to the sealed gap, and the plug structure is formed at the other end called outer end herein of the said two ends;
    and
    wherein the sealed gap is completely filled with a thermal interface material having fluidity, a portion of the storage tunnel is filled with the same thermal interface material, and the remaining portion of the storage tunnel is filled with a gas.

2. The lid of claim 1, wherein the lid further includes a ring-form of notch at the lower side of the top piece, in which the sealing ring is mounted.

3. The lid of claim 1, wherein the lid further includes a slippery skin formed on an inner surface of the storage tunnel.

4. The lid of claim 1, wherein the plug structure is a screw mounted in a screw hole, a headless screw with a rubber ring mounted in a screw hole, or a plug that seals a hole.

5. The lid of claim 1, wherein the plug structure for the storage tunnel comprises a hole extending down from the outer end of the storage tunnel into the foot, a locking material arranged in a lower portion of the hole, and a pin with a head, and wherein the pin goes through the covering piece with its tip portion being inserted into the locking material and its head being kept above the covering piece for sealing a tiny hole through the covering piece.

6. The lid of claim 1, wherein the plug structure at an outer end of the injection tunnel comprises a hole extending down from the outer end of the storage tunnel into the foot, a locking material arranged in a lower portion of the hole, and a pin with a head, and wherein the pin goes through the covering piece with its tip portion being inserted into the locking material and its head being kept above the covering piece for sealing a tiny hole through the covering piece.

7. The lid of claim 1, wherein the lid further includes a slippery skin formed on an inner surface of the storage tunnel.

8. The lid of claim 7, wherein the slippery skin is a layer of lubricant silicone oil or a layer of coating.

9. The lid of claim 1, wherein the covering piece is mounted in the cavity through an adhesive layer or by a metal to metal welding.

10. The lid of claim 1, wherein the covering piece consists of a plurality of layers of foils.

11. The lid of claim 1, wherein the lidded flip chip package further includes a thermally conductive mesh in the sealed gap.

12. The lid of claim 1, wherein the thermal interface material with fluidity is a liquid metal, including gallium and its alloys.

13. The lid of claim 1, wherein the gas in the storage tunnel is an inert gas, including nitrogen and helium.

* * * * *